(12) United States Patent
Chung et al.

(10) Patent No.: US 9,237,288 B2
(45) Date of Patent: Jan. 12, 2016

(54) SIGNAL MODULATING INTERFACE FOR A SOLID STATE ELECTRONIC DEVICE

(71) Applicant: City University of Hong Kong, Kowloon (HK)

(72) Inventors: Shu Hung Henry Chung, Mid-Levels (HK); Jiangjing Wang, Hubei Province (CN)

(73) Assignee: City University of Hong Kong, Hong Kong (HK)

( * ) Notice: Subject to any disclaimer, the term of this patent is extended or adjusted under 35 U.S.C. 154(b) by 96 days.

(21) Appl. No.: 14/026,517

(22) Filed: Dec. 19, 2013

(65) Prior Publication Data

US 2015/0181141 A1    Jun. 25, 2015

(51) Int. Cl.
*H04N 5/378* (2011.01)

(52) U.S. Cl.
CPC ........................... *H04N 5/378* (2013.01)

(58) Field of Classification Search
CPC ................................ G05F 1/575; H02M 3/156

USPC ............................................................ 363/39
See application file for complete search history.

(56) References Cited

U.S. PATENT DOCUMENTS

| | | | |
|---|---|---|---|
| 5,583,422 A * | 12/1996 | Schirmer et al. | 323/224 |
| 7,969,756 B1 * | 6/2011 | Wu | 363/46 |
| 2008/0205095 A1 * | 8/2008 | Pinon et al. | 363/39 |
| 2010/0060181 A1 * | 3/2010 | Choi et al. | 315/224 |
| 2010/0283438 A1 * | 11/2010 | Chung et al. | 323/268 |
| 2011/0109281 A1 * | 5/2011 | Yabuzaki et al. | 323/210 |
| 2013/0279216 A1 * | 10/2013 | Nguyen et al. | 363/41 |

\* cited by examiner

*Primary Examiner* — James Hannett
(74) *Attorney, Agent, or Firm* — Renner Kenner Greive Bobak Taylor & Weber

(57) ABSTRACT

A signal modulating interface for a solid state electronic device includes an input arranged to receive a control signal from a driver arranged to control the solid state electronic device, and a signalling module connected to the input wherein the signalling module is arranged to generate a modulated control signal by eliminating unwanted triggering signal portions capable of false triggering the solid state electronic device from the control signal for transmission to the solid state electronic device.

25 Claims, 28 Drawing Sheets

(a) turn-off gate-source voltage of $S_2$ (b) turn-off gate-source voltage of $S_2$ enlarged at the spurious triggering pulse (c) turn-off drain current of $S_2$ (d) turn-off drain-source voltage of $S_2$

| $R_W$ and $R_P$ | shifting level | |
|---|---|---|
| | analysis | experiment |
| $R_W = 68k\Omega$ and $R_P = 120k\Omega$ | 3.2V | 3.0V |
| $R_W = 56k\Omega$ and $R_P = 120k\Omega$ | 2.9V | 2.7V |
| $R_W = 22k\Omega$ and $R_P = 68k\Omega$ | 2.2V | 2.0V |
| $R_W = 22k\Omega$ and $R_P = 120k\Omega$ | 1.4V | 1.1V |

FIGURE 25

SIGNAL MODULATING INTERFACE FOR A SOLID STATE ELECTRONIC DEVICE

TECHNICAL FIELD

The present invention relates to a signal modulating interface for a solid state electronic device and particularly, although not exclusively, to a circuit arrangement arranged to prevent unwanted triggering of solid-state electronic devices due to false triggering signals.

BACKGROUND

A power electronics system is the combination of power semiconductor devices, inductors, capacitors and resistors to process and convert electric energy from an available level to another desired and usable level. The soul of a power electronics circuit is the solid-state switching devices, which are controlled to operate at ON and OFF state repetitively to achieve power conversion and regulation. The low-current control signal generated by a logic circuit will be received by a gate driver to produce an input with enough high current for the gate of the switching devices so as to turn the switching devices on and off. For illustrative purpose, a driving circuit topology having a typical totem pair configuration 100 is shown in FIG. 1.

Increase in switching frequency has always been in great demand to enhance power density and further miniaturize the switching converters. Fast-switching capability commensurate with high switching frequency is also primary concern to reduce switching losses. In the bridge-leg configuration that are extensively found in synchronous buck converters, half/full bridge converters and inverters, there are two complementary switches, one is the control switch which determines the switching speed, the other is the synchronous switch which is in ZVS switching.

High switching speed of the switching devices may result in a spurious triggering pulse in the gate-source voltage of the synchronous switch, which, if goes higher than the threshold voltage of the switching devices, can partially or even fully turn on the synchronous switch that is supposed to be off.

SUMMARY OF THE INVENTION

In accordance with a first aspect of the present invention, there is provided a signal modulating interface for a solid state electronic device comprising: an input arranged to receive a control signal from a driver arranged to control the solid state electronic device; and a signalling module connected to the input wherein the signalling module is arranged to generate a modulated control signal by eliminating unwanted triggering signal portions capable of false triggering the solid state electronic device from the control signal for transmission to the solid state electronic device.

In an embodiment of the first aspect, the signal modulating interface is disposed between the solid state electronic device and the driver.

In an embodiment of the first aspect, the signal modulating interface is arranged to modulate the control signal such that the unwanted triggering signal portions of the control signal are modulated to be below a triggering threshold of the solid state electronic device.

In an embodiment of the first aspect, the signalling module comprises at least one voltage source arranged to generate at least one modulating voltage for modulating the control signal.

In an embodiment of the first aspect, the at least one voltage source is connected in series with an output of the driver.

In an embodiment of the first aspect, the control signal is modulated such that the modulated control signal comprises a positive voltage signal when the driver outputs an activation control signal $V_{g,H}$ for activating the solid state electronic device and a negative voltage signal when the driver outputs a deactivation control signal $V_{g,L}$ for deactivating the solid state electronic device.

In an embodiment of the first aspect, the negative voltage signal is arranged to modulate the unwanted triggering signal portions to be below the triggering threshold of the solid state electronic device.

In an embodiment of the first aspect, the at least one voltage source for modulating the control signal is an external active voltage source.

In an embodiment of the first aspect, the external active voltage source comprises at least one dc-dc converter or at least one dc-ac converter.

In an embodiment of the first aspect, the at least one voltage source for modulating the control signal is a passive voltage source comprising a circuit arrangement.

In an embodiment of the first aspect, the circuit arrangement comprises capacitive components, resistive components, and semiconductor components.

In an embodiment of the first aspect, the circuit arrangement is arranged without any external voltage sources.

In an embodiment of the first aspect, the circuit arrangement comprises two capacitors $C_N$ and $C_P$; two resistors $R_N$ and $R_P$; and a diode $D_P$.

In an embodiment of the first aspect, the circuit arrangement is arranged such that the capacitor $C_N$ and the resistor $R_N$ is connected in parallel defining a voltage $V_{CN}$; the capacitor $C_P$ and the resistors $R_P$ is connected in parallel defining a voltage $V_{CP}$; and the diode $D_P$ is being disposed between the two capacitors $C_N$ and $C_P$.

In an embodiment of the first aspect, the circuit arrangement is arranged to modulate the control signal such that the positive voltage of the modulated control signal for activating the solid state electronic device is $V_{CP}$ and the negative voltage of the modulated control signal for deactivating the solid state electronic device is $-V_{CN}$.

In an embodiment of the first aspect, magnitude of the voltages $V_{CN}$ and $V_{CP}$ are dependent on a ratio between the resistors $R_N$ and $R_P$.

In an embodiment of the first aspect, magnitude of the voltages $V_{CN}$ and $V_{CP}$ are independent on a duty cycle of the solid state electronic device.

In an embodiment of the first aspect, $V_{CN}$ and $V_{CP}$ are defined by $$V_{CN} = \frac{R_N}{R_N + R_P} V_{g,H} \text{ and}$$

$$V_{CP} = \frac{R_P}{R_N + R_P} V_{g,H} \text{ at steady state.}$$

In an embodiment of the first aspect, the circuit arrangement is arranged such that $V_{CN}$ and $V_{CP}$ remain substantially constant at all times and are independent of the duty cycle of the control signal outputted from the driver.

In an embodiment of the first aspect, $V_{CN}$ and $V_{CP}$ remain substantially constant by arranging time constants $R_N C_N$ and $R_P C_P$ to be much longer than a switching period of between the positive and negative voltages; and arranging the capacitance of capacitor $C_N$ and/or $C_P$ to be much larger than a capacitance $C_{gs}$ associated with the solid state electronic device.

In an embodiment of the first aspect, the capacitances and resistances of the capacitors and resistors are defined by $R_N C_N = R_P C_P$ for accelerating a transition between voltages $V_{CP}$ and $-V_{CN}$.

In an embodiment of the first aspect, the signal modulating interface further comprises an accessory circuit arranged to alter a transition time from $-V_{CN}$ to $V_{CP}$.

In an embodiment of the first aspect, the accessory circuit comprises inductive components and semiconductor devices.

In an embodiment of the first aspect, the accessory circuit comprises an inductor $L_R$ and two diodes arranged in a circuit loop.

In an embodiment of the first aspect, the accessory circuit is disposed between the driver and the signalling module of the signal modulating interface for altering the transition time from $-V_{CN}$ to $V_{CP}$.

In an embodiment of the first aspect, the solid state electronic device is a transistor device.

In an embodiment of the first aspect, the transistor device is a MOSFET.

In an embodiment of the first aspect, the capacitance $C_{gs}$ associated with the solid state electronic device is a gate-source capacitance of the MOSFET.

In an embodiment of the first aspect, the driver for controlling the solid state electronic device is a gate driver.

In an embodiment of the first aspect, the signal modulating interface is disposed between the gate driver and the MOSFET gate.

BRIEF DESCRIPTION OF THE DRAWINGS

Embodiments of the present invention will now be described, by way of example, with reference to the accompanying drawings in which:

FIG. 25 is a table showing and comparing the theoretical and experimental results of the shifting-level of the gate-source voltage under different resistances $R_N$ and $R_P$;

DETAILED DESCRIPTION OF THE PREFERRED EMBODIMENT

Figure 1:
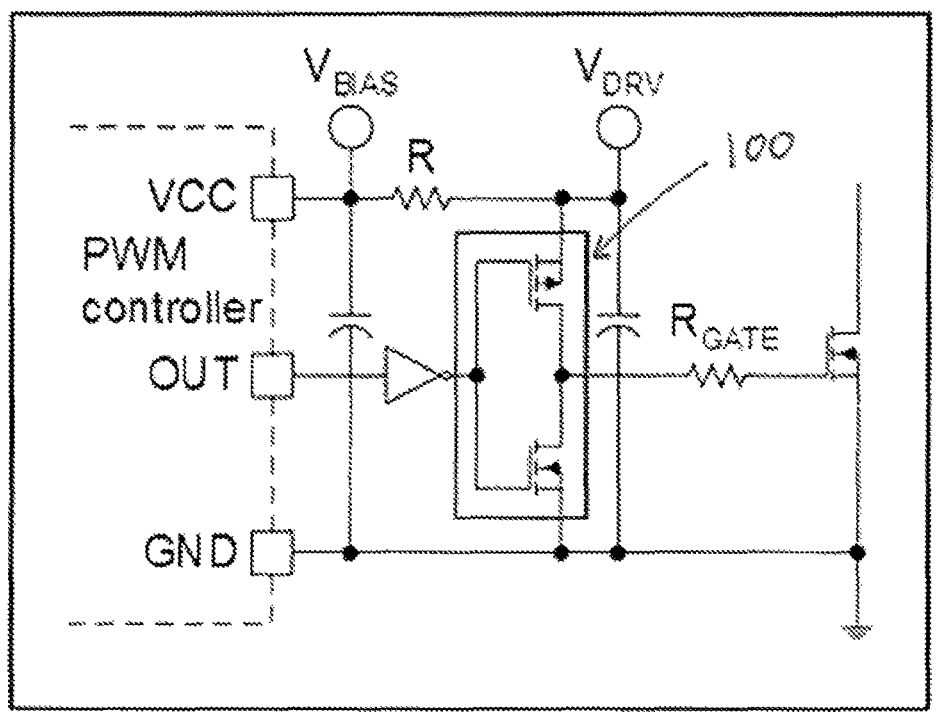
FIG. 1 shows a typical totem pair configuration for driving circuits.
Figure 2:
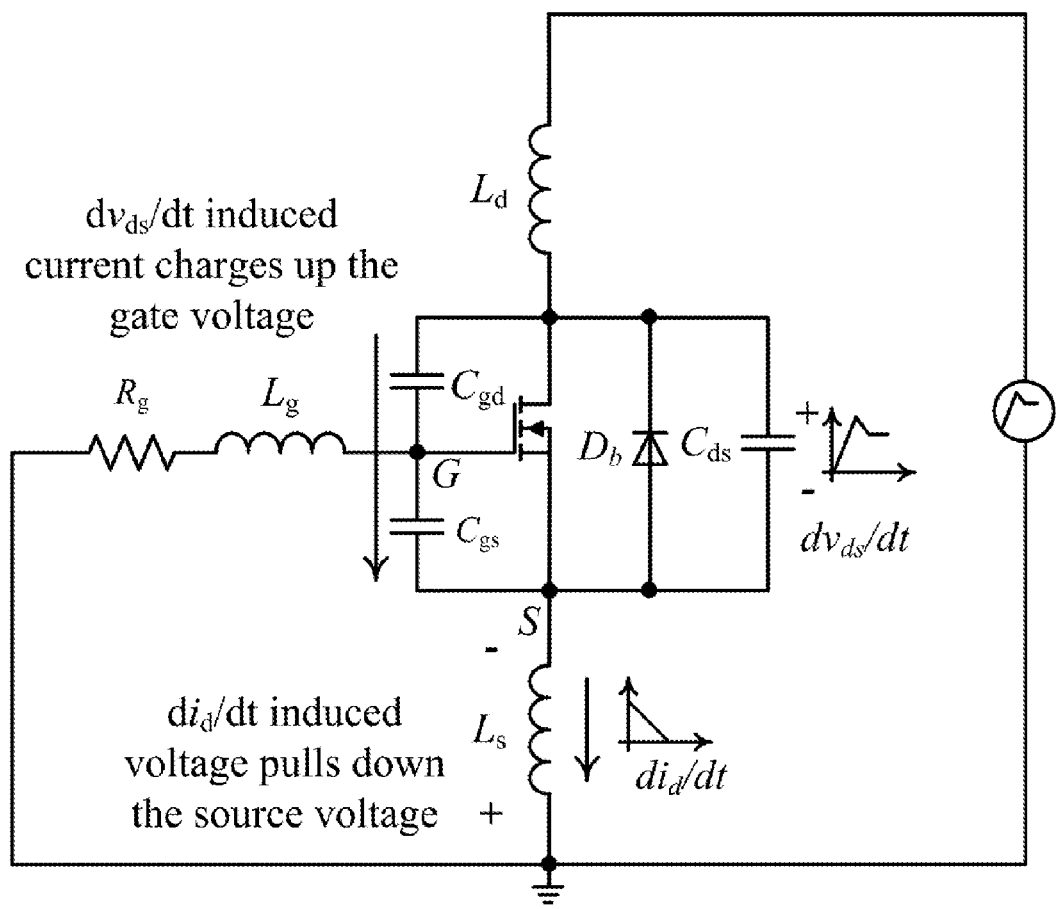
FIG. 2 illustrates the mechanism of a spurious triggering pulse in switching devices in a bridge-leg configuration.

The inventors of the present application have devised, through experimentation and trials, the mechanism of the spurious triggering pulse which is shown in FIG. 2. As shown in the Figure, an increase in $v_{ds}$ will induce a current through $C_{gd}$, charging up the gate voltage of the switch simultaneously, the negative voltage generated across $L_s$ by the decreasing drain current reduces the source voltage of the switch, both of which may result in a spurious triggering pulse.

Figure 3:
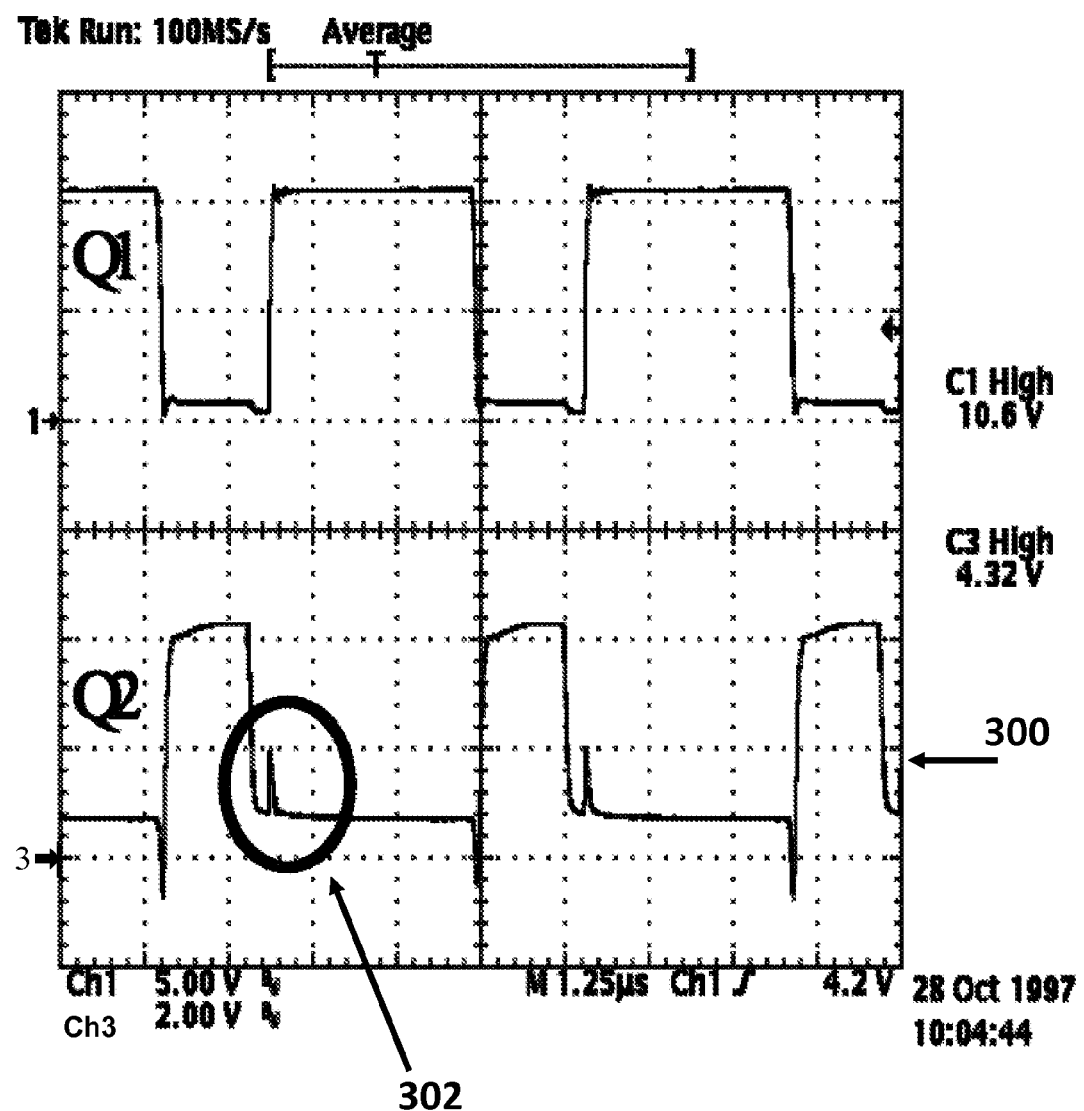
FIG. 3 shows a waveform having a spurious triggering pulse (gate bounce)

In FIG. 3, there is shown a waveform 300 having a spurious triggering pulse 302 (gate bounce). The inventors of the present application have devised that the adverse effects for this spurious triggering pulse to be exceeding the threshold voltage include slowing down of the voltage slew rate and incurring excessive switching losses to a shoot-through that degrades system reliability. Therefore, in order to ensure a reliable and efficient operation of the bridge-leg configuration, the spurious triggering pulse must be alleviated below the threshold voltage or even eliminated.

The inventors of the present application have also devised, through experimentation and trials, that methods for suppressing a spurious triggering pulse/signal in switching devices can be generally classified into two categories.

The first method involves slowing down the switching speed by changing parameters of the control switch, or to reduce the gate path impedance, namely, the gate inductance and gate resistance, of the synchronous switch. However, a decrease in switching speed can also be translated into increase in switching losses, which deviates from the objective of high power efficiency; and the internal gate drive resistance and inductance in a power switch cannot be avoided.

Figure 4:
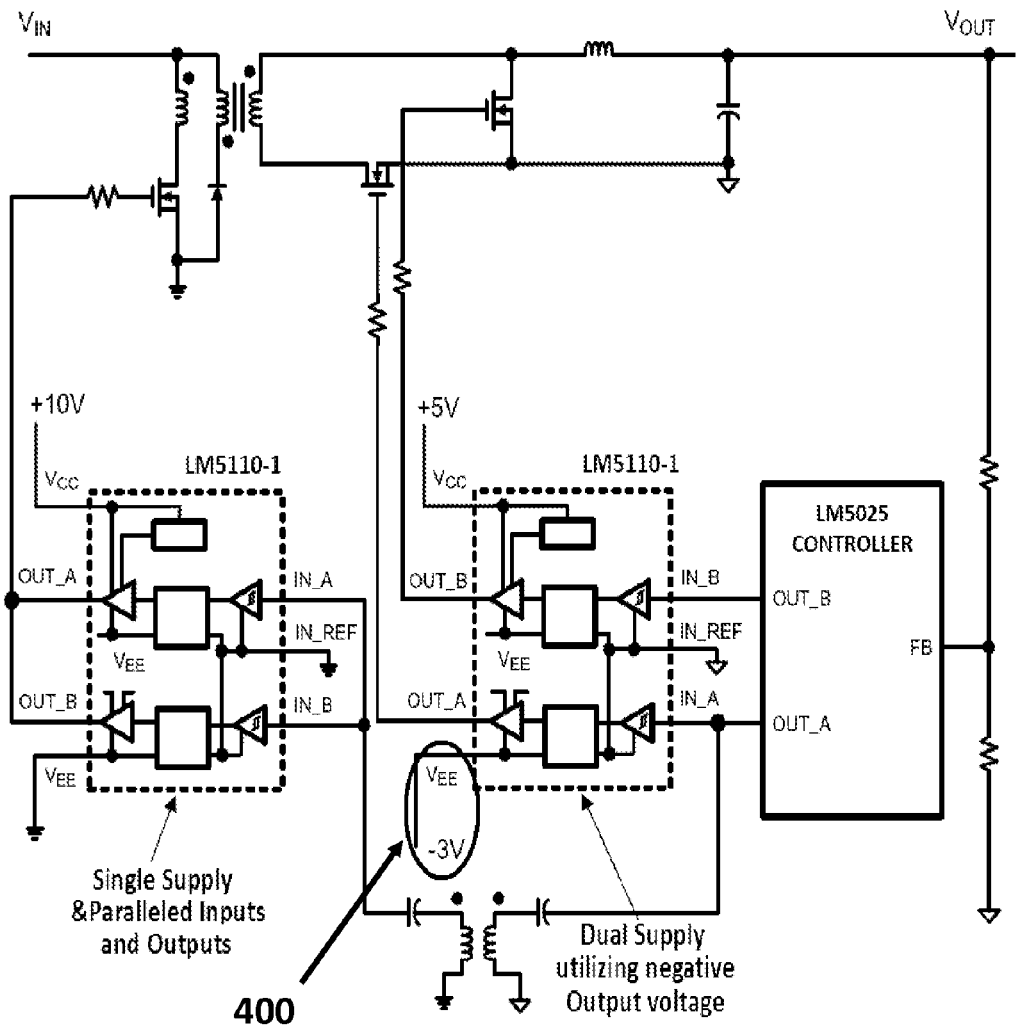
FIG. 4 shows a modified gate drive circuit with an additional negative voltage source for introducing a negative offset to the gate voltage so as to guarantee that the spurious triggering pulse should not exceed the threshold voltage.
Figure 5:
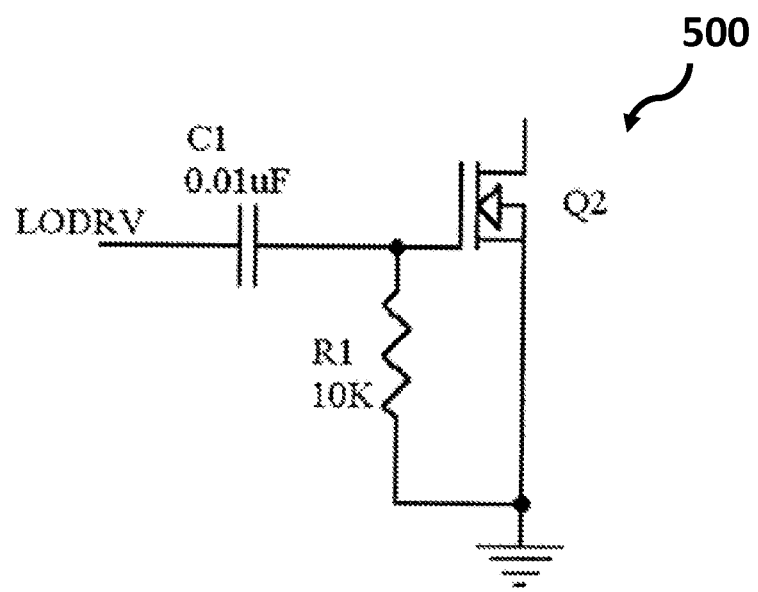
FIG. 5 shows an auxiliary circuit for suppressing the spurious triggering pulse (gate bounce)
Figure 6:
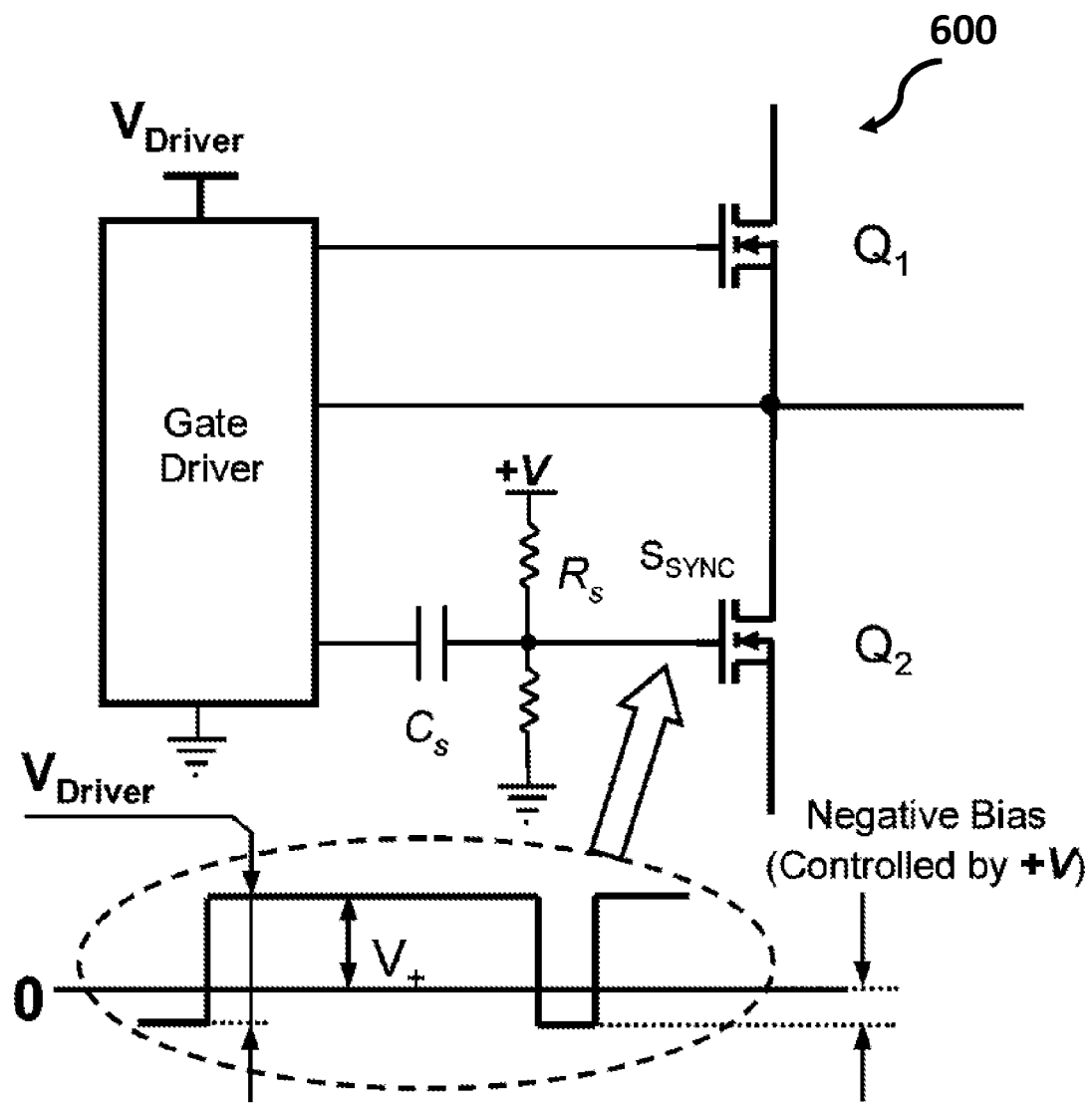
FIG. 6 shows an alternative auxiliary circuit for suppressing the spurious triggering pulse (gate bounce)

The second method is to modify the gate drive circuit to introduce a negative offset to the gate voltage to guarantee the spurious triggering pulse do not exceed the threshold voltage. This method may be realized either by using an additional negative voltage source 400 as shown in FIG. 4, or by using an auxiliary AC circuit 500, 600 as shown in FIG. 5 or 6. Both RC circuits 500, 600 as shown in FIGS. 5 and 6 can achieve level-shifting of the gate voltage by filtering out the DC component of the original gate signal. However, the shifting level is either related to the duty cycle of the gate signal and cannot be controlled or requires additional voltage source.

The inventors of the present application have devised other methods for suppressing a spurious triggering pulse/signal. For example, a negative gate drive voltage may be introduced. However, an extra active switching device, e.g. MOSFET, will be required to produce the negative gate drive voltage.

With reference now to FIGS. 7A-7B, 8A-8B and 10A-10B, there is provided a signal modulating interface for a solid state electronic device comprising: an input arranged to receive a control signal from a driver arranged to control the solid state electronic device; and a signalling module connected to the input wherein the signalling module is arranged to generate a modulated control signal by eliminating unwanted triggering signal portions capable of false triggering the solid state electronic device from the control signal for transmission to the solid state electronic device.

Preferably, the signal modulating interface is disposed between the solid state electronic device and the driver. Also, the signal modulating interface is arranged to modulate the control signal such that the unwanted triggering signal portions of the control signal are modulated to be below a triggering threshold of the solid state electronic device.

In a preferred embodiment, the signalling module comprises at least one voltage source arranged to generate at least one modulating voltage for modulating the control signal. In particular, the at least one voltage source is connected in series with an output of the driver. Preferably, the control signal is modulated such that the modulated control signal comprises a positive voltage signal when the driver outputs an activation control signal $V_{g,H}$ for activating the solid state electronic device and a negative voltage signal when the driver outputs a deactivation control signal $V_{g,L}$ for deactivating the solid state electronic device. In particular, the negative voltage signal is arranged to modulate the unwanted triggering signal portions to be below the triggering threshold of the solid state electronic device.

Figure 7A:
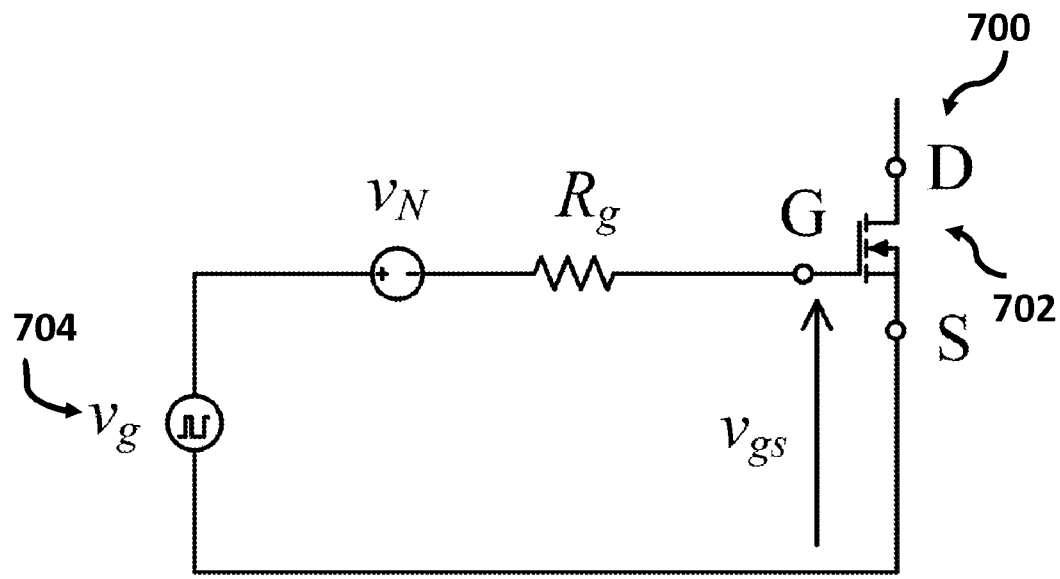
FIG. 7A shows a basic circuit structure illustrating a concept for modulating a control signal for controlling a solid state electronic device in accordance with an embodiment of the present invention.
Figure 7B:
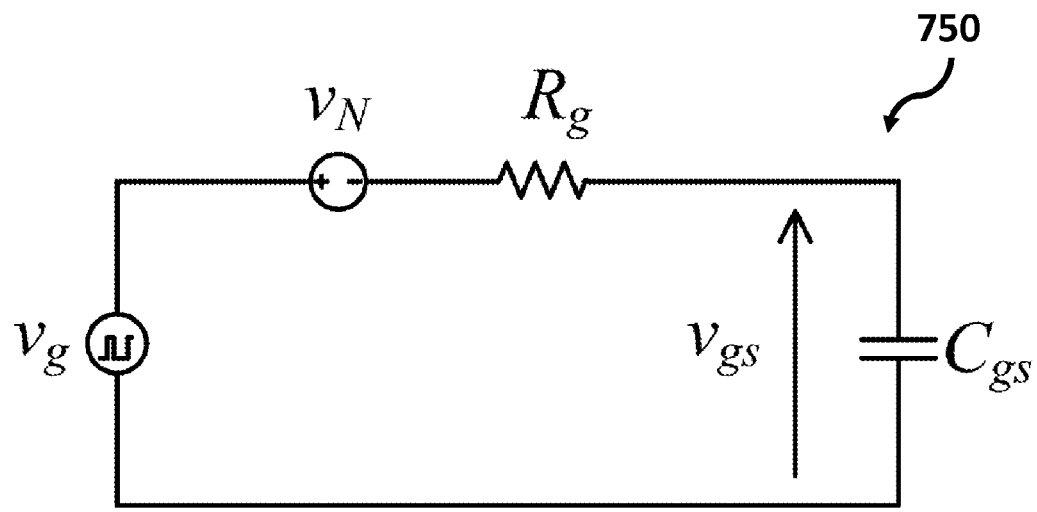
FIG. 7B shows the equivalent circuit diagram of the basic circuit structure of FIG. 7A.

FIGS. 7A-7B and 8A-8B present a concept of the present invention. In particular, FIG. 7A shows a basic circuit structure 700 for modulating a control signal for controlling a solid state electronic device 702 whilst FIG. 7B is an equivalent circuit 750 of FIG. 7A. In the Figures, the capacitor $C_{gs}$ and the resistor $R_g$ represent the gate-source capacitance and the gate resistance of the MOSFET 702 respectively. In the present invention, an additional voltage source $v_N$ acting as a signal modulating interface is added in series with the output of the MOSFET driver 704, i.e., $v_g$ for modulating the control signal for controlling the MOSFET 702.

Figure 8A:
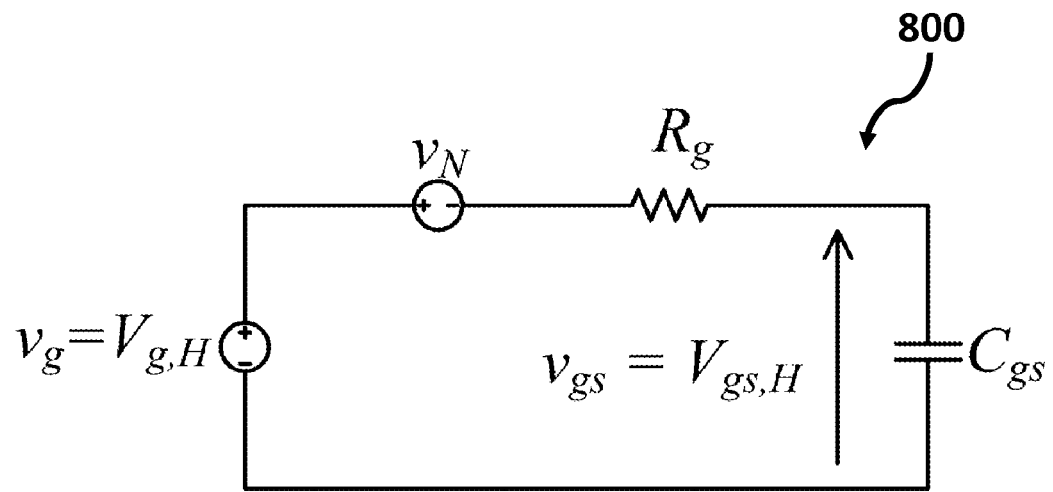
FIG. 8A illustrates the equivalent circuit of FIG. 7B when the output of the MOSFET driver is high.

FIG. 8A illustrates the equivalent circuit 800 when the output of $v_g$ is high, $v_{g,H}$. Thus, the gate-source voltage $v_{gs}$ is $$v_{gs}=V_{gs,H}=V_{g,H}-v_N \quad (1)$$

Figure 8B:
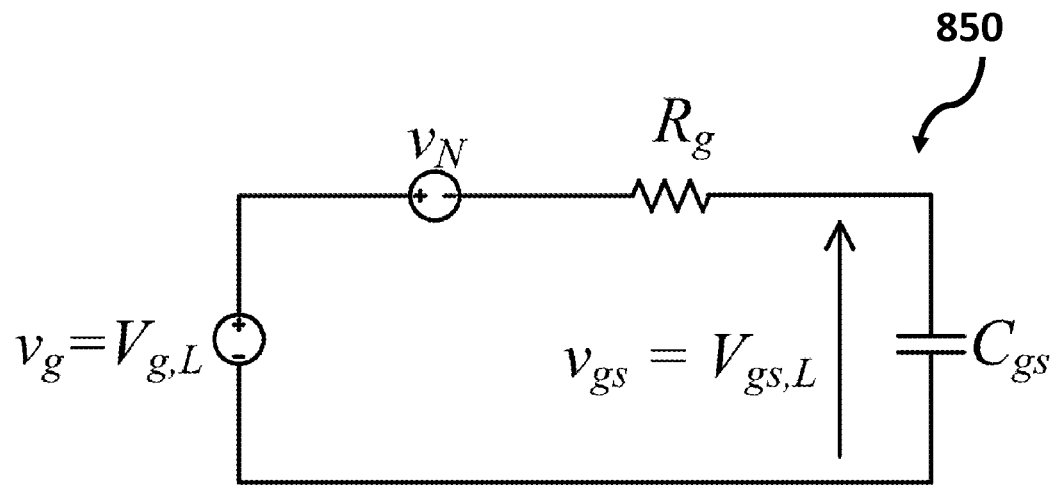
FIG. 8B illustrates the equivalent circuit of FIG. 7B when the output of the MOSFET driver is low.

FIG. 8B illustrates the equivalent circuit 850 when the output of $v_g$ is low, $v_{g,L}$. Thus, the gate-source voltage $v_{gs}$ is $$v_{gs}=V_{gs,L}=V_{g,L}-v_N \quad (2)$$

Therefore, if $v_N$ is designed to satisfy the following requirement of $$v_{g,H}>v_N>V_{g,L} \quad (3)$$

$v_{gs}$ gives the following characteristics $$v_{gs}>0, \text{ when } v_g=V_{g,H} \quad (4)$$

$$v_{gs}<0, \text{ when } v_g=V_{g,L} \quad (5)$$

Figure 9:
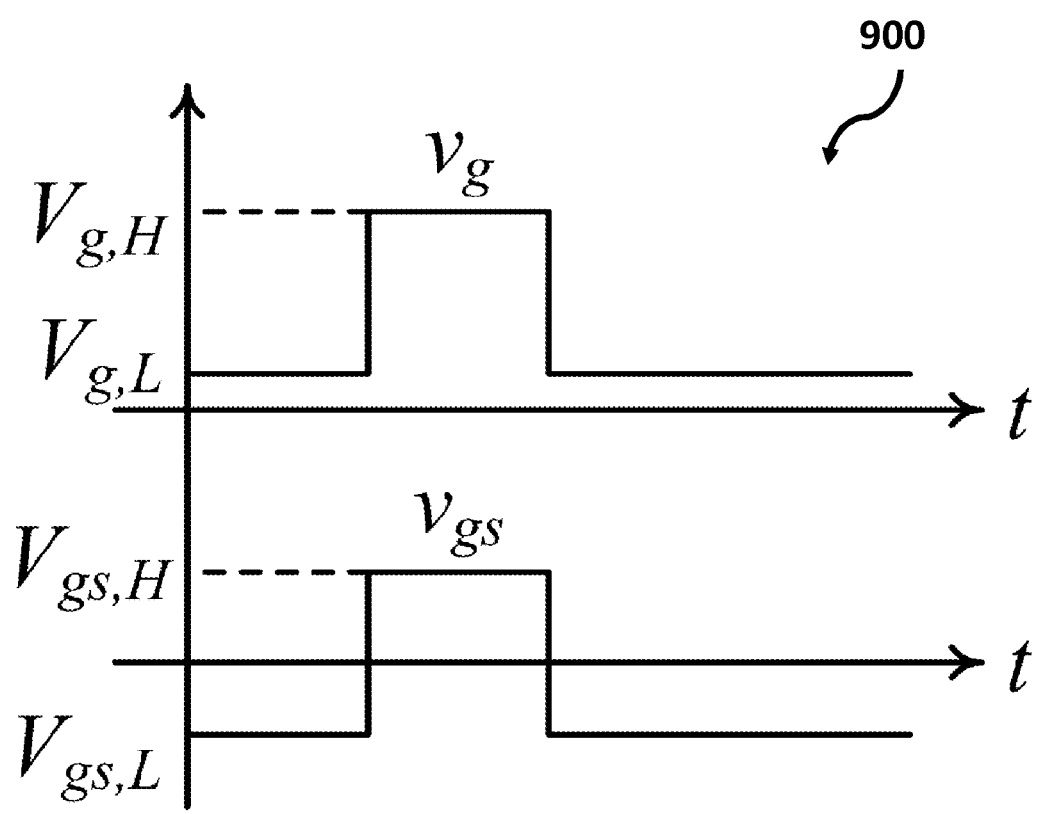
FIG. 9 shows the waveforms of the output of the MOSFET driver $v_g$ and the gate-source voltage $v_{gs}$.

FIG. 9 shows the waveforms 900 of the output of the MOSFET driver $v_g$ and the gate-source voltage $v_{gs}$. Preferably as shown in FIG. 9, the MOSFET 702 of FIG. 7A can be driven with a positive voltage at turn-on (i.e. Equation (4)) and a negative voltage at turn-off (i.e. Equation (5)). In particular, the negative voltage at turn-off can shift the spurious triggering pulse below the threshold voltage and prevent the spurious turn-on of the MOSFET 702.

In the present invention, the voltage source $v_N$ can be realized by an active or passive approach.

In one embodiment, the active approach is based on using a voltage source, such as dc-dc converter or ac-dc converter to generate the required voltage level. In particular, this embodiment is similar to the one as shown in FIG. 4 in which an additional voltage source 400 is used, although the voltage source 400 in FIG. 4 is used to power the entire MOSFET driver. The voltage source in this embodiment of the present invention is connected to the output of the MOSFET driver 704.

Figure 10A:
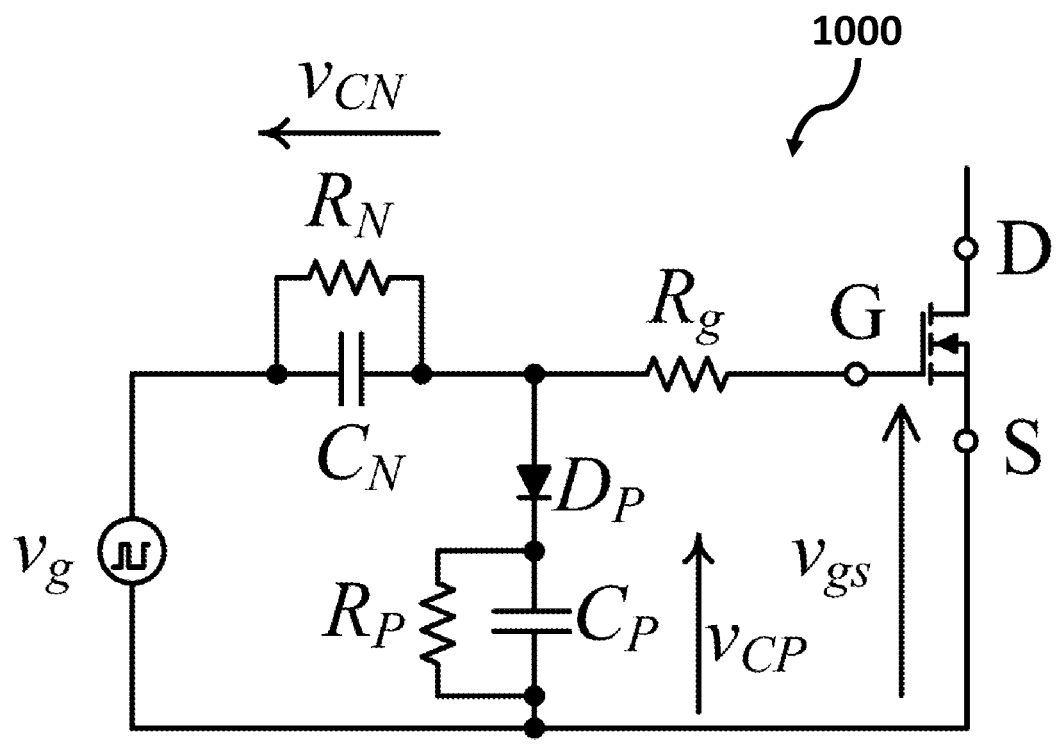
FIG. 10A shows a passive circuit structure arranged to function as a voltage source for modulating a control signal for controlling a solid state electronic devices in accordance with an embodiment of the present invention.
Figure 10B:
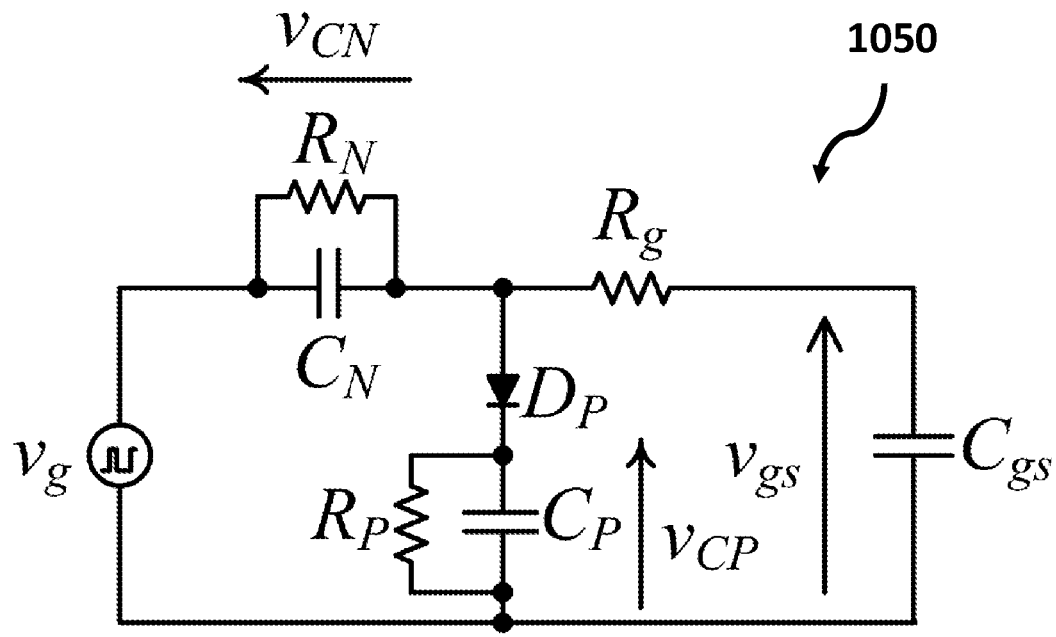
FIG. 10B is an equivalent circuit of the circuit structure of FIG. 10A.

In an alternative embodiment, a passive approach may be used. Preferably, the passive approach does not require any external source, but a passive circuit. FIGS. 10A and 10B show a passive circuit structure 1000 and its equivalent circuit 1050 arranged to function as a voltage source for modulating a control signal for controlling a solid state electronic device.

In this embodiment, the circuit 1050 as shown in FIG. 10B comprises two capacitors, $C_N$ and $C_P$, two resistors, $R_N$ and $R_P$, and one diode $D_P$. In particular, the circuit is arranged such that the capacitor $C_N$ and the resistor $R_N$ is connected in parallel defining a voltage $V_{CN}$; the capacitor $C_P$ and the resistors $R_P$ is connected in parallel defining a voltage $V_{CP}$; and the diode $D_P$ is being disposed between the two capacitors $C_N$ and $C_P$. Preferably, the impedance of $C_P$ is chosen to be much larger than that of $C_{gs}$ so that the latter will not affect the designed shifting level. The operation of the circuit in the embodiment as shown in FIGS. 10A-10B will be described in greater detail below.

A. Start-Up

Figure 11:
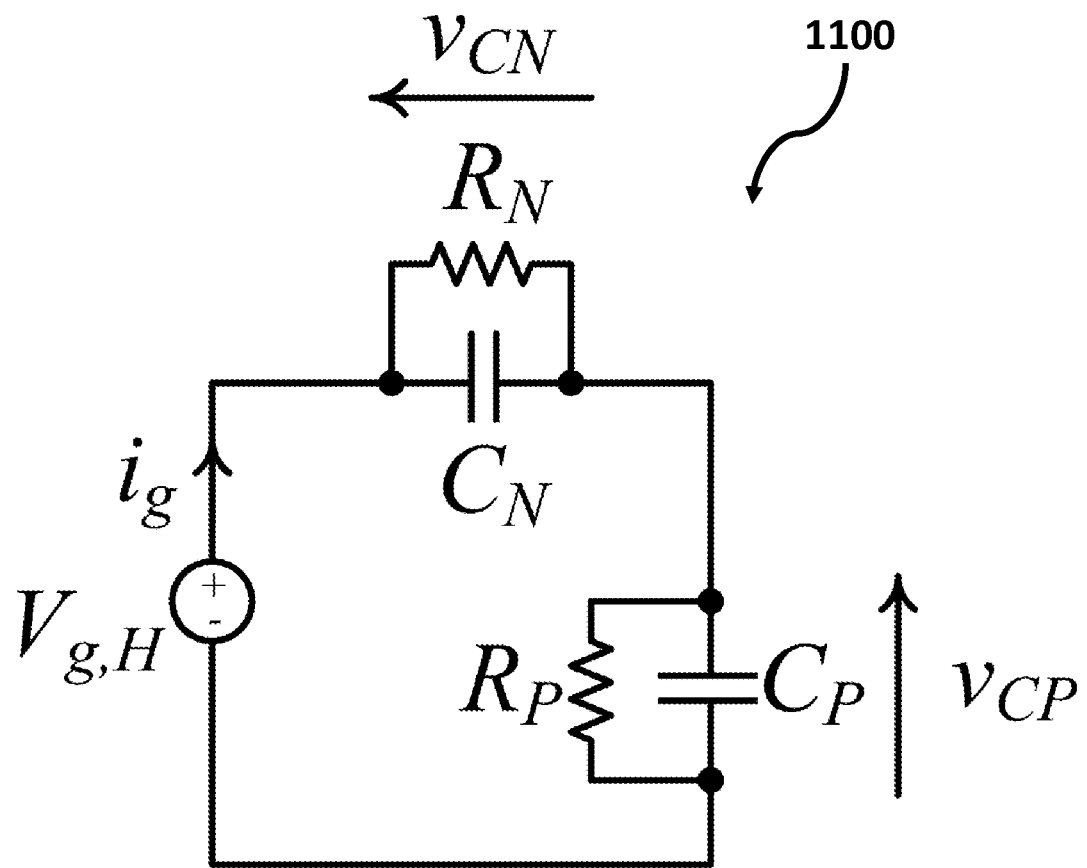
FIG. 11 shows the circuit structure of FIG. 10A with the output of the MOSFET driver $v_g$ represented by a DC voltage source for exploring the operation of the start-up process of the circuit structure of FIG. 10A.

A start-up period exists for the voltage across $C_N$ and $C_P$, $V_{CN}$ and $V_{CP}$ to attain steady-state values, during which, $C_N$ and $C_P$ are charged up through the gate driver at turn-on, and discharged through their respective paralleled resistors at turn-off. In other words, the charge-up of $C_N$ and $C_P$ are accomplished during those turn-on transients and the voltage at turn-off should remain almost unchanged for normal operation. As a result, the circuit 1100 as shown in FIG. 11 with a DC voltage source can be used to explore the operation of the start-up process.

$$i_g = \frac{v_{CN}}{R_{CN}} + C_N \frac{dv_{CN}}{dt} = \frac{v_{CP}}{R_{CP}} + C_P \frac{dv_{CP}}{dt} \tag{6}$$

$$v_{CN} + v_{CP} = V_{g,H} \tag{7}$$

By conducting Laplace and then inverse Laplace Transform, $v_{CN}(t)$ can be expressed as, $$v_{CN}(t) = \frac{R_N}{R_N + R_P} V_{g,H} \left[1 - e^{\frac{t}{R_0(C_N + C_P)}}\right] + \frac{C_P}{C_N + C_P} V_{g,H} e^{\frac{t}{R_0(C_N + C_P)}} \tag{8}$$

where $R_0 = R_N R_P / (R_N + R_P)$.

From this equation, it can be seen that the initial value is $$v_{CN}(0) = \frac{C_P}{C_N + C_P} V_{g,H},$$

and the final value is $$v_{CN}(\infty) = \frac{R_N}{R_N + R_P} V_{g,H}.$$

If the RC network is chosen to satisfy $$\frac{C_P}{C_N + C_P} = \frac{R_N}{R_N + R_P},$$

i.e., $R_N C_N = R_P C_P$, not only the initial value is equal to final value, but also the exponential terms can be cancelled out. Therefore, although $C_N$ and $C_P$ do not affect the final value, the start-up process can be preferably accelerated if $R_N C_N = R_P C_P$.

B. Steady-State Analysis

Figure 12A:
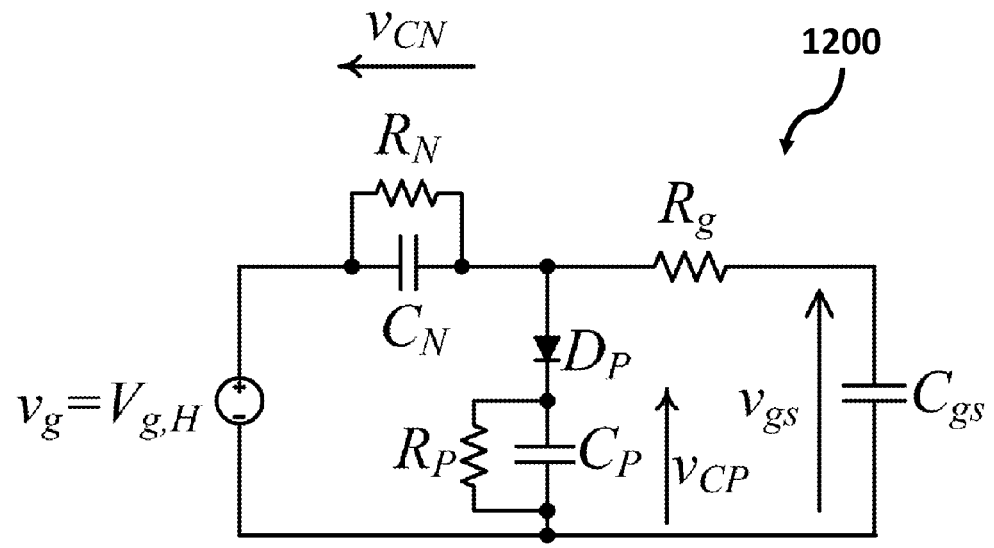
FIG. 12A shows the equivalent circuit of the circuit structure of FIG. 10A when diode $D_P$ is forward biased.

When $v_g = V_{g,H}$, $D_P$ is forward biased. FIG. 12A shows the equivalent circuit 1200 when $D_P$ is forward biased. In order to provide stable voltage for the gate-source voltage $v_{gs}$, $V_{CN}$ and $V_{CP}$ are dependent on the ratio between $R_N$ and $R_P$ as shown in the analysis for the start-up process. Assuming that the forward voltage of $D_P$ is zero, $$V_{CN} = \frac{R_N}{R_N + R_P} V_{g,H} \tag{9}$$

$$V_{CP} = \frac{R_P}{R_N + R_P} V_{g,H} \tag{10}$$

$v_{gs}$ is the same as the voltage across $C_P$. Thus, $$v_{gs} = V_{CP} \tag{11}$$

Figure 12B:
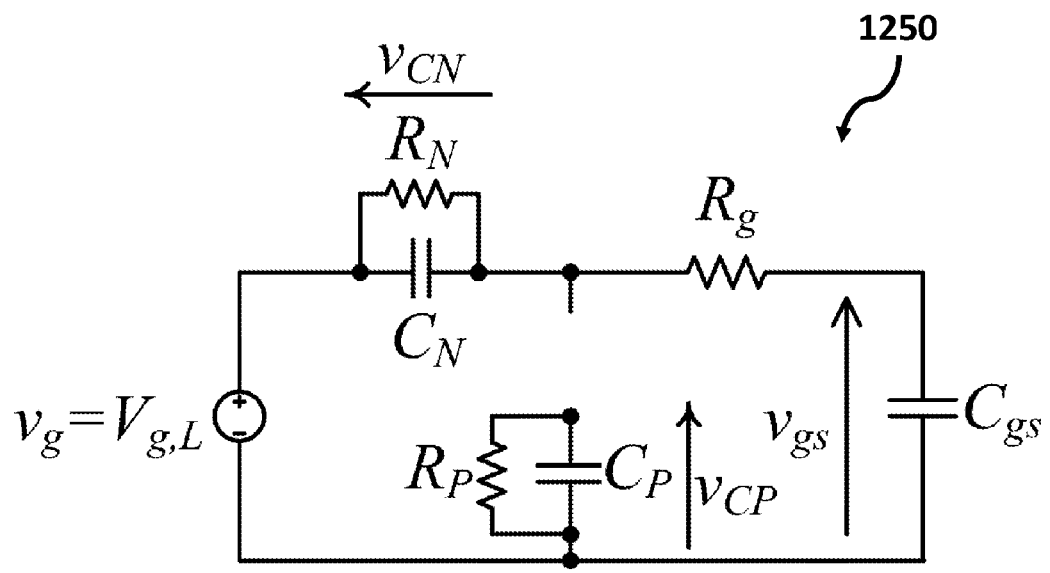
FIG. 12B shows the equivalent circuit of the circuit structure of FIG. 10A when diode $D_P$ is reverse biased.

When $v_g = V_{g,L}$, $D_P$ is reverse biased. FIG. 12B shows the equivalent circuit 1250 when $D_P$ is reverse biased. Thus, $v_{gs}$ is equal to $$v_{gs} = V_{g,L} - V_{CN} \tag{12}$$

C. Transient Analysis

Assume that $V_{g,L}$ is zero, and the turn-off steady state voltage across $C_N$ and $C_P$ are $V_{CN\_OFF}$ and $V_{CP\_OFF}$ respectively, which are the initial conditions for the turn-on process and will be calculated in the calculation for the turn-off process.

When $v_g = V_{g,H}$, $D_P$ is forward biased. FIG. 12A shows the equivalent circuit 1200 when $D_P$ is forward biased. The turn-on transient can be described by Equation (7) and the following:

$$i_g = \frac{v_{CN}}{R_N} + C_N \frac{dv_{CN}}{dt} = \frac{v_{CP}}{R_P} + C_P \frac{dv_{CP}}{dt} + i_{Cgs} \tag{13}$$

$$i_{Cgs} = C_{gs} \frac{dv_{gs}}{dt} \tag{14}$$

$$v_{Cgs} = R_g i_{Cgs} + v_{gs} \tag{15}$$

Considering the initial conditions and performing Laplace Transform for Equations (7) and (13)-(15), the gate source voltage $v_{gs}$ can be expressed as, $$v_{gs}(s) = \frac{\frac{V_{g,H}}{s} \frac{R_0}{R_N} + (C_N V_{g,H} - C_N V_{CN\_OFF} + C_P V_{CP\_OFF}) R_0}{(C_N + C_P) C_{gs} R_0 R_g s^2 + [(C_N + C_P) R_0 + (R_0 + R_g) C_{gs}] s + 1} \tag{16}$$

where $R_0 = R_N R_P / (R_N + R_P)$.

Let $\tau_m^2 = (C_N + C_P) C_{gs} R_0 R_g$, $\tau_g = (C_N + C_P) R_0 + (R_0 + R_g) C_{gs}$, $V_{CP}$ is given by Equation (10). By performing inverse Laplace Transform, $v_{gs}$ can be solved.

If $4\tau_m^2 < \tau_n^2$, (17)

$$v_{gs}(t) = V_{CP} - \frac{V_{CP}}{\tau_a - \tau_b}(\tau_a e^{-t/\tau_a} - \tau_b e^{-t/\tau_b}) +$$

$$\frac{(C_N V_{g,H} - C_N V_{CN\_OFF} + C_P V_{CP\_OFF}) R_0}{\tau_a - \tau_b} (e^{-t/\tau_a} - e^{-t/\tau_b})$$

where $\tau_a = \frac{\tau_n + \sqrt{\tau_n^2 - 4\tau_m^2}}{2}$, $\tau_b = \frac{\tau_n - \sqrt{\tau_n^2 - 4\tau_m^2}}{2}$.

If $4\tau_m^2 > \tau_n^2$, (18)

$$v_{gs}(t) = V_{CP} - V_{CP} e^{-t/\tau_c} \left(\frac{\tau_d}{\tau_c} \sin\frac{t}{\tau_d} + \cos\frac{t}{\tau_d}\right) +$$

$$(C_N V_{g,H} - C_N V_{CN\_OFF} + C_P V_{CP\_OFF}) R_0 \left(\frac{\tau_d}{\tau_c^2} + \frac{1}{\tau_d}\right) e^{-t/\tau_c} \sin\frac{t}{\tau_d}$$

where $\tau_c = \frac{2\tau_m^2}{\tau_n}$, $\tau_d = \frac{2\tau_m^2}{\sqrt{4\tau_m^2 - \tau_n^2}}$.

In either scenario, final value theorem indicates that the final value of $v_{gs}$ is $V_{CP}$, which is the same as the voltage across $C_P$. However, as the turn-on time is a limited duration, $v_{gs}$ can approaches $V_{CP}$ but never arrives right at $V_{CP}$. In order to ensure $v_{gs}$ can approximate $V_{CP}$ to the largest extent, $C_N$ and/or $C_P$ must be much larger than $C_{gs}$. Based on this condition, the turn-on steady state voltage across $C_N$ and $C_P$ can be given by, $$V_{CN\_ON} = V_{g,H} - V_{CP} = \frac{R_N}{R_N + R_P} V_{g,H} \quad (19)$$

$$V_{CP\_ON} = V_{CP} = \frac{R_P}{R_N + R_P} V_{g,H} \quad (20)$$

When $v_g = V_{g,L}$, $D_P$ is reverse biased. FIG. 12B shows the equivalent circuit 1250 when $D_P$ is reverse biased. $V_{CN\_ON}$ and $V_{CP\_ON}$ are the initial conditions for the turn-off process. The turn-off transient is governed by the following equations:

$$v_{gs} + i_{Cgs} R_g + v_{CN} = 0 \quad (21)$$

$$i_{Cgs} = C_{gs} \frac{dv_{gs}}{dt} = C_N \frac{dv_{CN}}{dt} + \frac{v_{CN}}{R_N} \quad (22)$$

Considering the initial conditions and performing Laplace Transform for Equations (21)-(22), $v_{gs}$ can be expressed as, $$v_{gs}(s) = \frac{C_{gs}(R_N + R_g) V_{CP\_ON} - C_N R_N V_{CN\_ON} + s R_g C_{gs} C_N V_{CP\_ON}}{C_{gs} R_g C_N R_N s^2 + (C_{gs} R_N + C_N R_N + R_g C_{gs}) s + 1} \quad (23)$$

Let $\tau_P^2 = C_{gs} R_g C_N R_N$, $\tau_q = C_{gs} R_N + C_N R_N + R_g C_{gs}$, by performing inverse Laplace Transform, $v_{gs}$ can be solved.

If $4\tau_p^2 < \tau_q^2$, (24)

$$v_{gs}(t) = \frac{C_{gs}(R_N + R_g) V_{CP\_ON} - C_N R_N V_{CN\_ON}}{\tau_e - \tau_f} \left(e^{-t/\tau_e} - e^{-t/\tau_f}\right) +$$

$$\frac{R_g C_{gs} R_N C_N V_{CP\_ON}}{\tau_e - \tau_f} \left(\frac{1}{\tau_f} e^{-t/\tau_f} - \frac{1}{\tau_e} e^{-t/\tau_e}\right)$$

where $\tau_e = \frac{\tau_q + \sqrt{\tau_q^2 - 4\tau_p^2}}{2}$, $\tau_f = \frac{\tau_q - \sqrt{\tau_q^2 - 4\tau_p^2}}{2}$.

If $4\tau_p^2 > \tau_q^2$, (25)

$$v_{gs}(t) = [C_{gs}(R_N + R_g) V_{CP\_ON} - C_N R_N V_{CN\_ON}]$$

$$\left(\frac{\tau_h}{\tau_g^2} + \frac{1}{\tau_h}\right) e^{-t/\tau_g} \sin\frac{t}{\tau_h} +$$

$$R_g C_{gs} R_N C_N V_{CP\_ON} \left(\frac{\tau_h}{\tau_g^2} + \frac{1}{\tau_h}\right) \left(\frac{1}{\tau_h} \cos\frac{t}{\tau_h} - \frac{1}{\tau_g} \sin\frac{t}{\tau_h}\right) e^{-t/\tau_g}$$

where $\tau_g = \frac{2\tau_p^2}{\tau_q}$, $\tau_h = \frac{2\tau_p^2}{\sqrt{4\tau_p^2 - \tau_q^2}}$.

In either scenario, final value theorem indicates that the final value of $v_{gs}$ is 0. However, if $R_N$ is large enough to neglect the discharging of $C_N$ through $R_N$, $v_{gs}(S)$ can be expressed as, $$v_{gs}(s) = \frac{C_{gs} V_{CP\_ON} - C_N V_{CN\_ON} - s C_N C_{gs} R_g V_{CP\_ON}}{C_{gs} C_N R_g s^2 + (C_{gs} + C_N) s} \quad (26)$$

According to final value theorem, the final value of $v_{gs}$ is, $$V_{gs\_OFF} = \frac{C_{gs} V_{CP\_ON} - C_N V_{CN\_ON}}{C_N + C_{gs}} = \frac{(C_{gs} R_P - C_N R_N) V_{g,H}}{(C_N + C_{gs})(R_N + R_P)} \quad (27)$$

Moreover, if $C_N R_N \gg C_{gs} R_P$, i.e., $C_N \gg C_{gs} R_P / R_N$, $$V_{gs\_OFF} = -\frac{R_N}{R_N + R_P} V_{g,H}.$$

During the turn-off switching transient, $C_P$ discharges through $R_P$, and $V_{CP}$ is given by, $$v_{CP} = V_{CP\_ON} e^{-\frac{t}{R_P C_P}} \quad (28)$$

At the end of turn-off process, $$V_{CP\_OFF} = V_{CP\_ON} e^{-\frac{(1-D)T_s}{R_P C_P}} \quad (29)$$

where D is the duty cycle, and $T_s$ is the switching period. In order to ensure the reduction in $v_{CP}$ is negligible, $R_P C_P \gg (1-D)T_s$.

The power loss of the circuit can be estimated to be $$P_{diss} = \frac{V_{CN}^2}{R_{CN}} + \frac{V_{CP}^2}{R_{CP}} \quad (30)$$

Figure 13:
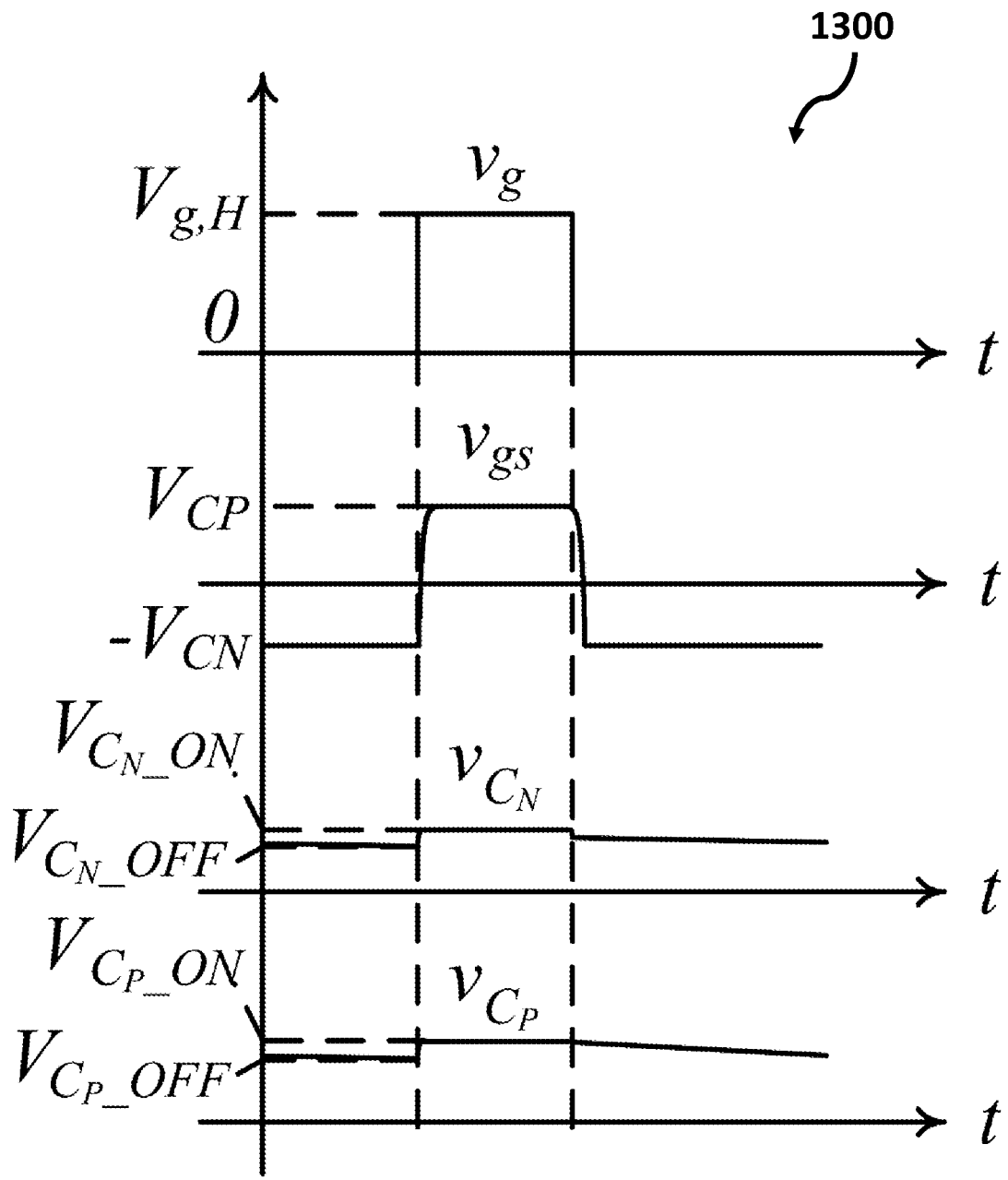
FIG. 13 shows the transient waveforms produced by the circuit structure of FIG. 10A.

The transient waveforms 1300 of the circuit 1000 in accordance with the embodiment of FIG. 10A are shown in FIG. 13. The above transient analysis implies that $V_{CP\_ON} \approx V_{CP\_OFF}$ and $V_{CN\_ON} \approx V_{CN\_OFF}$, as long as $C_N \gg C_{gs} R_P / R_N$, and the time constant $R_N C_N$ and $R_P C_P$ are much longer than the switching period. Optionally, $C_N$ and $C_P$ can be replaced by a constant voltage source with respective voltage level. In a preferred embodiment, level shift can be achieved without affecting the rise/fall time of the gate drive signal.

One of the advantages of the circuit 1000 in the present embodiment lies in that the voltage shifting level can be flexibly adjusted by the ratio between $R_N$ and $R_P$, and it will not be affected by the duty cycle of the MOSFET.

D. Value Design

Based on the detailed description above, the value design of the circuit 1000 in the present embodiment can be summarized as follows:

1. The negative voltage shifting-down level $V_{CN}$ is determined by Equation (9);
2. $R_P C_P \gg (1-D)T$, and $C_P \gg C_{gs}$; and
3. $R_P C_P = R_N C_N$.

It should be noted that is not mandatory to meet the requirement of the equation $R_P C_P = R_N C_N$, although it will accelerate the start-up process should it be satisfied.

Figure 14A:
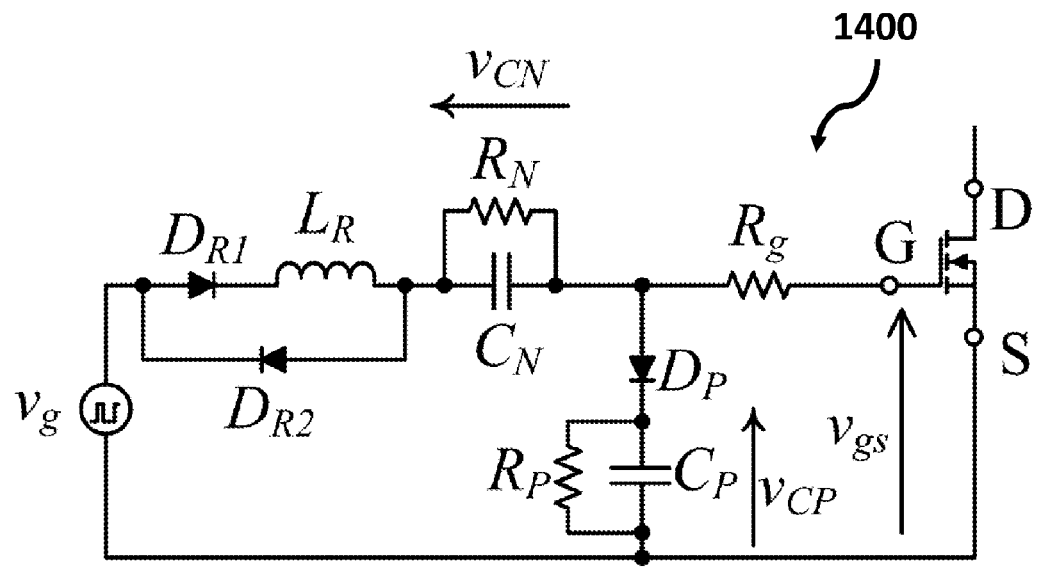
FIG. 14A shows a circuit structure of a resonant gate drive circuit in accordance with an embodiment of the present invention.
Figure 14B:
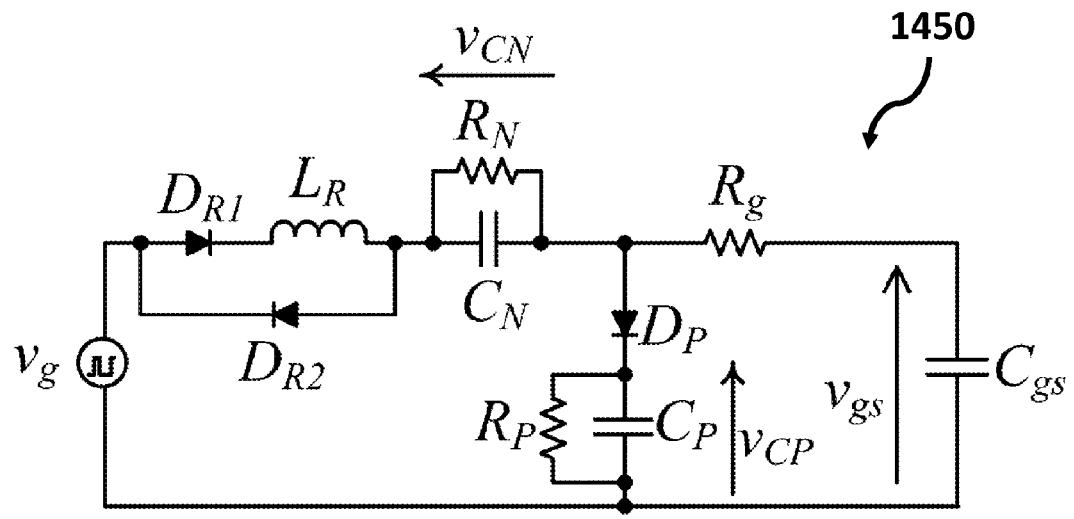
FIG. 14B is an equivalent circuit of the circuit structure of FIG. 14A.

In order to adjust of the rise time of $v_{gs}$, the embodiment of the circuit 1000 of FIG. 10A can be further modified. FIGS. 14A-B shows a resonant gate drive circuit in accordance with an embodiment of the present invention. In particular, FIG. 14A shows the circuit structure 1400 whilst FIG. 14B shows its equivalent circuit 1450.

Figure 15A:
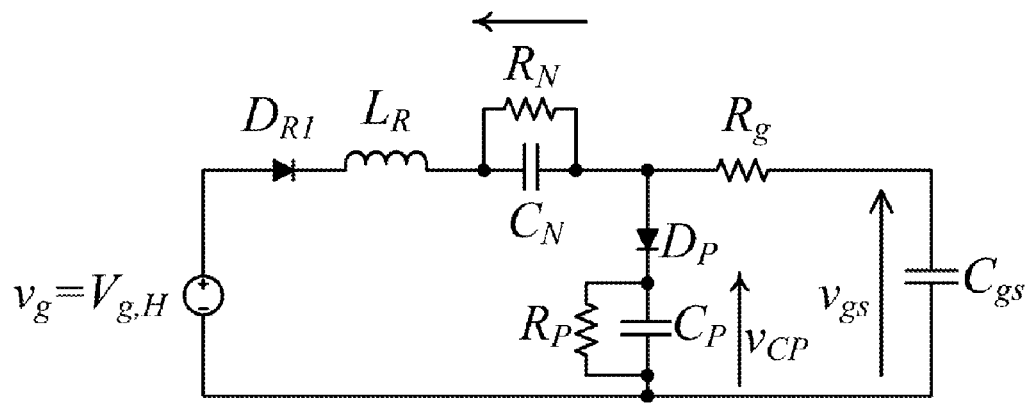
FIG. 15A illustrates the operation of the circuit structure of FIG. 14A before $v_{gs}$ rises to $V_{g,H}$ when $v_g = V_{g,H}$.
Figure 15B:
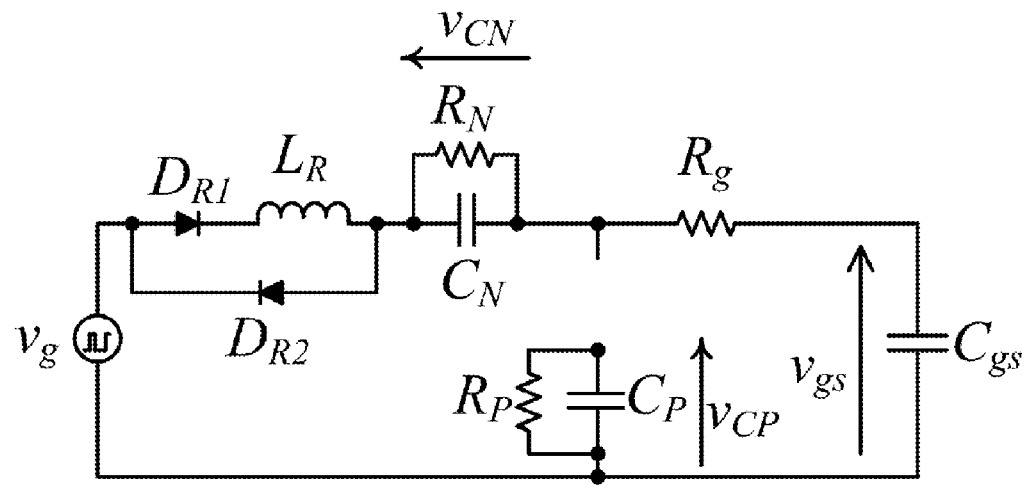
FIG. 15B illustrates the operation of the circuit structure of FIG. 14A after $v_{gs}$ rises to $V_{g,H}$ when $v_g = V_{g,H}$.
Figure 15C:
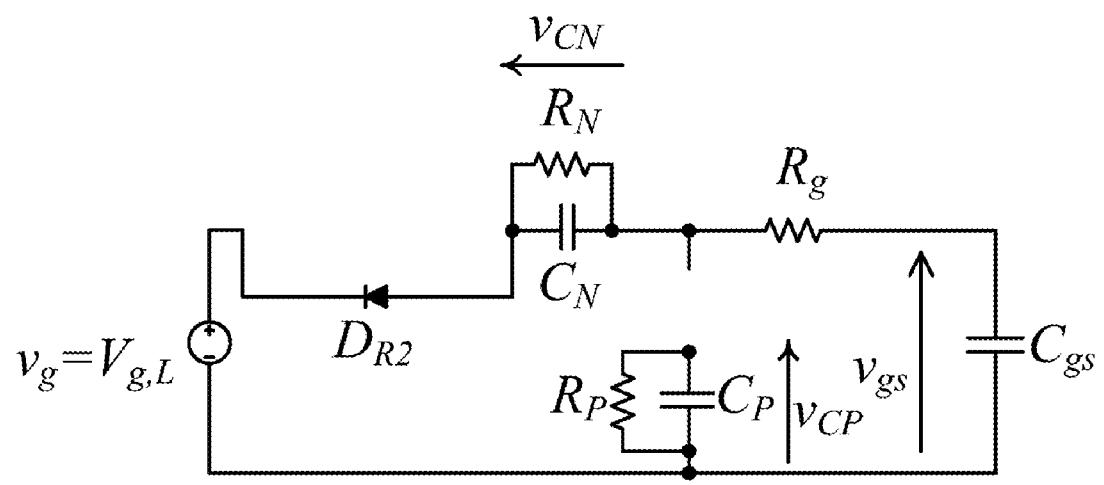
FIG. 15C illustrates the operation of the circuit structure of FIG. 14A when $v_g = V_{g,L}$.

In this embodiment of FIG. 14A, an inductor $L_R$ and two diodes $D_{R1}$ and $D_{R2}$ are added to adjust the rise time of $v_{gs}$. Preferably the inductor $L_R$ and the diodes $D_{R1}$ and $D_{R2}$ form a circuit loop. The operation of the circuit 1400 of FIG. 14A is depicted in FIGS. 15A-C. In particular, the operation of the circuit 1400 of FIG. 14A illustrated in FIGS. 15A-C is similar to that of the previous circuit shown in FIGS. 12A-B.

According to the analysis for the embodiment of the circuit 1000 in FIG. 10A, it is assumed that the time constants $R_N C_N$ and $R_P C_P$ are longer than the switching period of the MOSFET and $C_P \gg C_{gs}$. Thus, the voltages across $C_N$ and $C_P$ can be assumed to be relatively constant in each switching cycle. The operation of the circuit 1400 of FIG. 14A is described as follows with reference to FIGS. 15A-C.

When $v_g$ turns high, the inductor $L_R$ and the capacitors $C_N$ and $C_P$ will all be charged up before $v_{gs}$ reaches $V_{g,H}$ as presented in FIG. 15A. In particular, the rise time of $v_{gs}$ is determined by $L_R$ and $C_{gs}$. After that, the inductor current will circulate and diminish through $D_{R2}$ as presented in FIG. 15B. When $v_g = V_{g,L}$, $D_P$ is reverse biased and $C_{gs}$ will discharge through $D_{R2}$ as shown in FIG. 15C. Equations (9)-(12) can still be applied here to represent the steady-state operation of $v_{gs}$. During the turn-on transient, $v_{gs}$ increases according to, $$C_{gs} L_R \frac{d v_{gs}^2}{dt} + C_{gs} R_g \frac{d v_{gs}}{dt} + v_{gs} = V_{CP} \tag{31}$$

Let $\tau_s^2 = C_{gs} L_s$, $\tau_r = C_{gs} R_g$.

If $4\tau_s^2 < \tau_r^2$, $\tag{32}$ $$v_{gs}(t) = V_{CP} - \frac{V_{CP}}{\tau_i - \tau_j}\left(\tau_i e^{-t/\tau_i} - \tau_j e^{-t/\tau_j}\right)$$

where $\tau_i = \frac{\tau_r + \sqrt{\tau_r^2 - 4\tau_s^2}}{2}$, $\tau_j = \frac{\tau_r - \sqrt{\tau_r^2 - 4\tau_s^2}}{2}$.

If $4\tau_s^2 > \tau_r^2$, $\tag{33}$ $$v_{gs}(t) = V_{CP} - V_{CP} e^{-t/\tau_k}\left(\frac{\tau_l}{\tau_k}\sin\frac{t}{\tau_l} + \cos\frac{t}{\tau_l}\right)$$

where $\tau_k = \frac{2\tau_s^2}{\tau_r}$, $\tau_l = \frac{2\tau_s^2}{\sqrt{4\tau_s^2 - \tau_r^2}}$.

After $v_{gs}$ arrives at $V_{CP}$, which is the turn-on steady state voltage, the current in $L_R$ will drop to zero, $$L_R \frac{di_{LR}}{dt} = -V_{F1} - V_{F2} \tag{34}$$

where $V_{F1}$ and $V_{F2}$ are the forward voltage of $D_{R1}$ and $D_{R2}$ respectively. During the turn-off transient, $v_{gs}$ will decrease to $-V_{CN}$, and the fall time is determined by $C_{gs}$ and the gate loop impedance.

Figure 16:
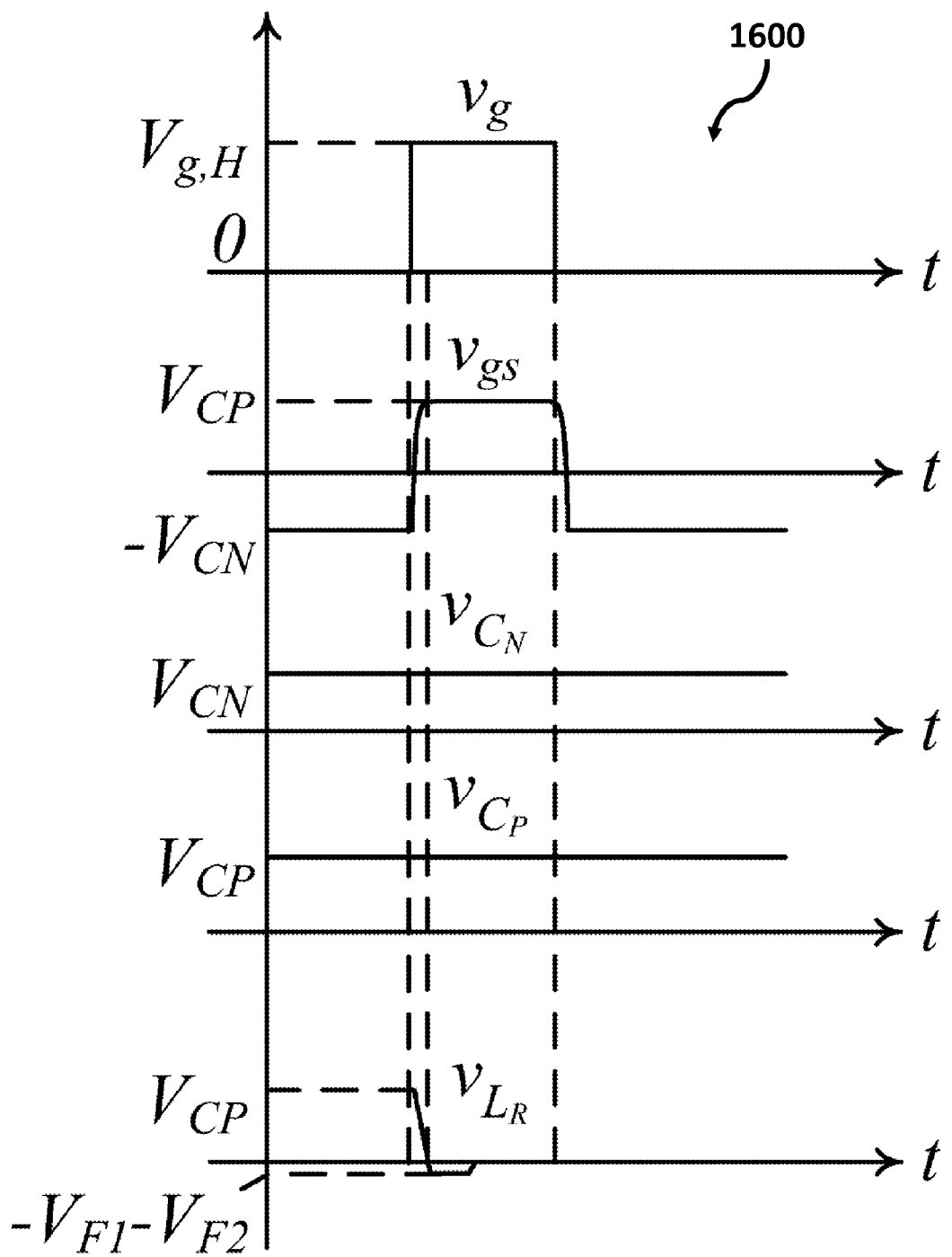
FIG. 16 shows the transient waveforms generated by the circuit of FIG. 14A.

In this way, for the present embodiment, not only a negative offset is given to $v_{gs}$ compared to $v_g$, which can help prevent the spurious turn-on of the MOSFET, adjustment of the rise time of $v_{gs}$ is also realized. FIG. 16 shows the transient waveforms 1600 generated by the preferred embodiment of the circuit 1400 of FIG. 14A.

In the present embodiment, the circuit 1400 mainly dissipates through $R_N$, $R_P$ and $L_R$. The current through $L_R$ can be approximated by the current through $C_{gs}$ during turn-on transient. The power loss of the circuit can be estimated to be $$P_{diss} = \frac{V_{CN}^2}{R_{CN}} + \frac{V_{CP}^2}{R_{CP}} + \frac{1}{T_s} L_R \int_0^{DT_s} i_g \frac{di_g}{dt} dt \tag{35}$$

where $i_g = C_{gs}\frac{dv_{gs}}{dt}$ and $\frac{di_g}{dt} = C_{gs}\frac{dv_{gs}^2}{dt^2}$.

To validate the various embodiments of the present invention, the inventors of the present application have devised a set of experiment on a designed test bench.

Figure 17:
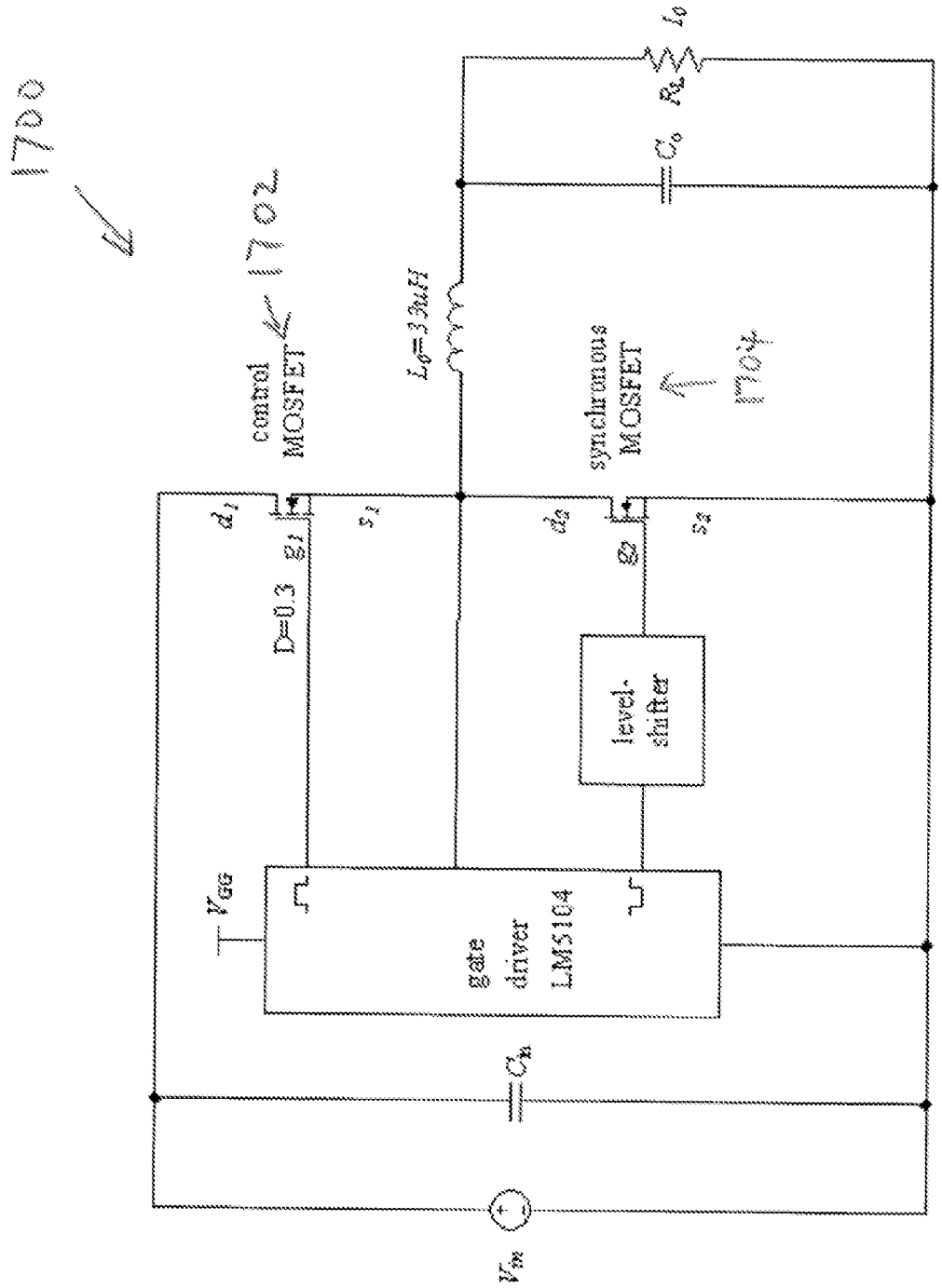
FIG. 17 shows the schematic diagram of a test bench used for validating the various embodiments of the present invention.

FIG. 17 shows the schematic diagram 1700 of a test bench used for validating the various embodiments of the present invention. In particular, the embodiment of the circuit 1000 of FIG. 10A is adopted as the level-shifter of FIG. 17. The verifications of the various embodiments of the present invention are intended, firstly, to demonstrate the undesirable consequences of the spurious triggering pulse, and the effectiveness of the various embodiments of the present invention in suppressing the spurious triggering pulse; and secondly, to evince the aforementioned advantages and value design of the level-shifter 1000.

In an embodiment of the verification as shown in FIG. 17, CSD17308Q3 is used for the control MOSFET 1702 and synchronous MOSFET 1704, which has a relatively low threshold voltage $V_{th} = 1.3V$ and thereby is more susceptible to spurious turn-on. The input voltage and output current of the synchronous buck converter are 20V and 8 A respectively. Originally, the gate drive voltage of the lower MOSFET 1704 swings between 0V and 15V. In this embodiment, when $S_1$ turns on, the peak absolute value of the spurious triggering pulse in $v_{gs2}$ attains 2.7V, exceeding the threshold voltage, therefore the spurious turn-on occurs. The gate drive voltage of the lower MOSFET 1704 is then shifted down to different extent by different $R_P/R_N$ ratio to obtain variation in the $V_{gH}/V_{gL}$ level.

Figure 18:
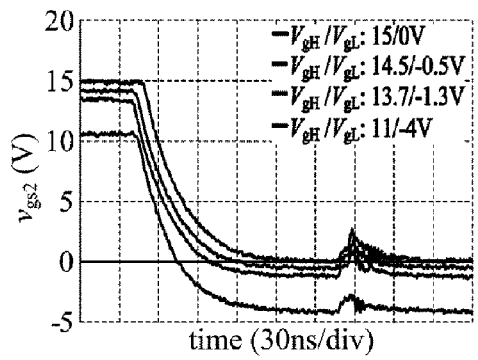
FIG. 18 shows the variation in the switching waveforms of $S_2$ of FIG. 17 at different $V_{gH}/V_{gL}$ values.
Figure 18:
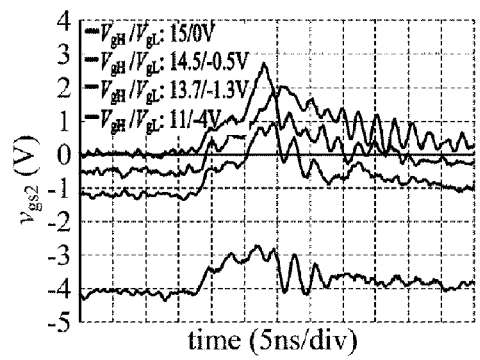
Figure 18:
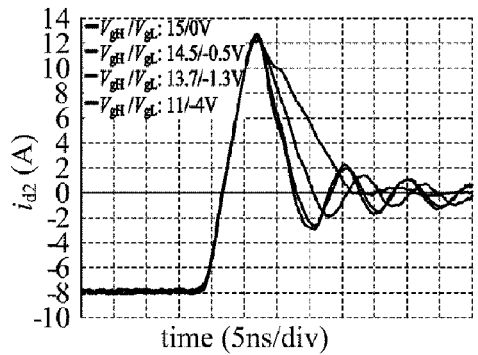
Figure 18:
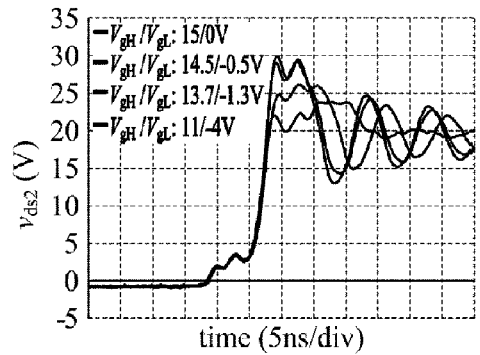

FIG. 18 shows the variation in the switching waveforms of $S_2$ of FIG. 17 at different $V_{gH}/V_{gL}$ values. In particular, FIGS. 18(a) and (b) shows the waveforms of $v_{gs2}$ at four different $V_{gH}/V_{gL}$ levels whilst FIGS. 18(c) and (d) illustrates that while the rising edge of $i_{d2}$ remains unchanged, the overshoot of $v_{ds2}$ is the smallest, and the falling edge of $i_{d2}$, which coincidences with the rising of $v_{ds2}$ and the occurrence of the spurious triggering pulse, is the slowest in the original case depicted in blue among the four scenarios.

As shown in FIG. 18, if the gate drive voltage is shifted down by 0.5V so as to pull down the peak value of the spurious triggering pulse but still maintain it above the threshold voltage, the falling edge of $i_{d2}$ is faster and the overshoot of $v_{ds2}$ is larger than the original scenario. On the other hand, if the gate drive voltage is shifted down by 1.3V to bring down the peak value of the spurious triggering pulse as well as hold it below the threshold voltage, the falling edge of $i_{d2}$ further speeds up and the overshoot of $v_{ds2}$ further rises up. In one embodiment, as long as the peak value of the spurious triggering pulse remains below the threshold voltage, further shift-down of the gate drive voltage hardly affects $i_{d2}$ and $v_{ds2}$.

Figure 19:
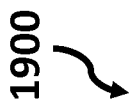
FIG. 19 is a table showing and comparing the turn-off switching losses under the four different $V_{gH}/V_{gL}$ values of FIG. 18.

FIG. 19 is a table 1900 showing and comparing the turn-off switching losses under the four scenarios (different $V_{gH}/V_{gL}$) as described with respect to FIG. 18. As shown in the table 1900, the results confirm that the spurious turn-on leads to substantial increase in the switching loss, and that such increase can be significantly reduced or even circumvented with the help of the level-shifter 1000 of the present invention, whose dissipation is negligible.

In general, when the spurious triggering pulse goes beyond the threshold voltage and the spurious turn-on occurs in a MOSFET, the drain current that is decreasing will increase, leading to a slower falling of the drain current, and the overshoot in the drain-source voltage will decrease. Although in some embodiments it seems that the reduction in the drain-source voltage is beneficial, this reduction can be readily offset by the higher switching loss incurred. The level-shifter in accordance with the embodiment of the present invention manages to alleviate and even eliminate the side effect of the spurious triggering pulse.

In order to show that the switching waveforms will not be affected if the operating condition does not trigger the spurious turn-on, another type of MOSFET BSC123N08NS3 with a higher threshold voltage $V_{th}$=3V is used. In one embodiment, according to the value design criteria, the original parameters for the level-shifter 1000 of the present invention are chosen as $R_N$=33 kΩ, $R_P$=120 kΩ, $C_N$=47 nF and $C_P$=15 nF.

Figure 20:
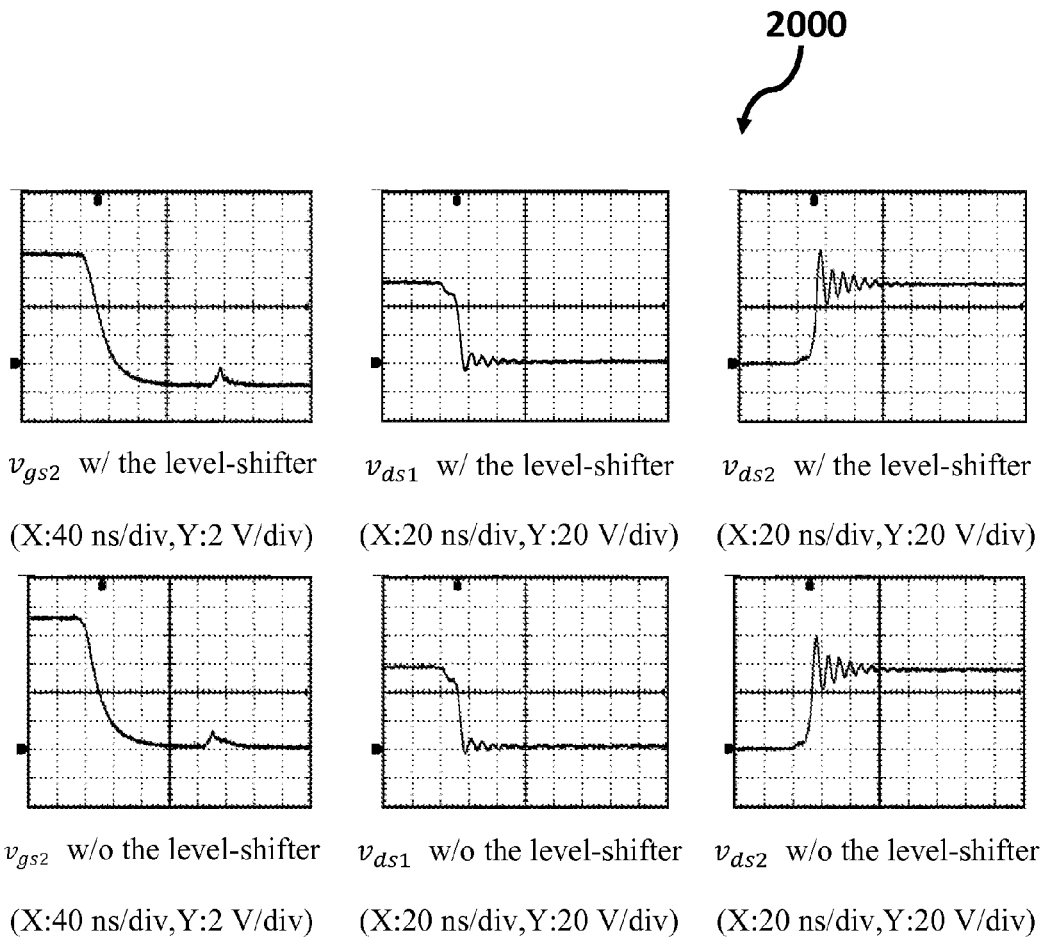
FIG. 20 shows different sets of graphs comparing the switching waveforms for the test bench of FIG. 17 with and without the level-shifter.

FIG. 20 shows different sets of graphs 2000 comparing the switching waveforms for the test bench 1700 of FIG. 17 with and without the level-shifter 1000 of the present invention. As shown in FIG. 20, with the level-shifter 1000, the gate-source voltage of the synchronous MOSFET $v_{gs2}$ is shifted down by 1.6V, while the switching speed of the drain-source voltage $v_{ds2}$ and $v_{ds2}$ are not substantially unaffected.

The distinctive advantages of the present invention are also demonstrated by the switching waveforms produced in the test bench 1700 of FIG. 17 under different operating conditions.

I. Input Voltage $V_{in}$

Figure 21:
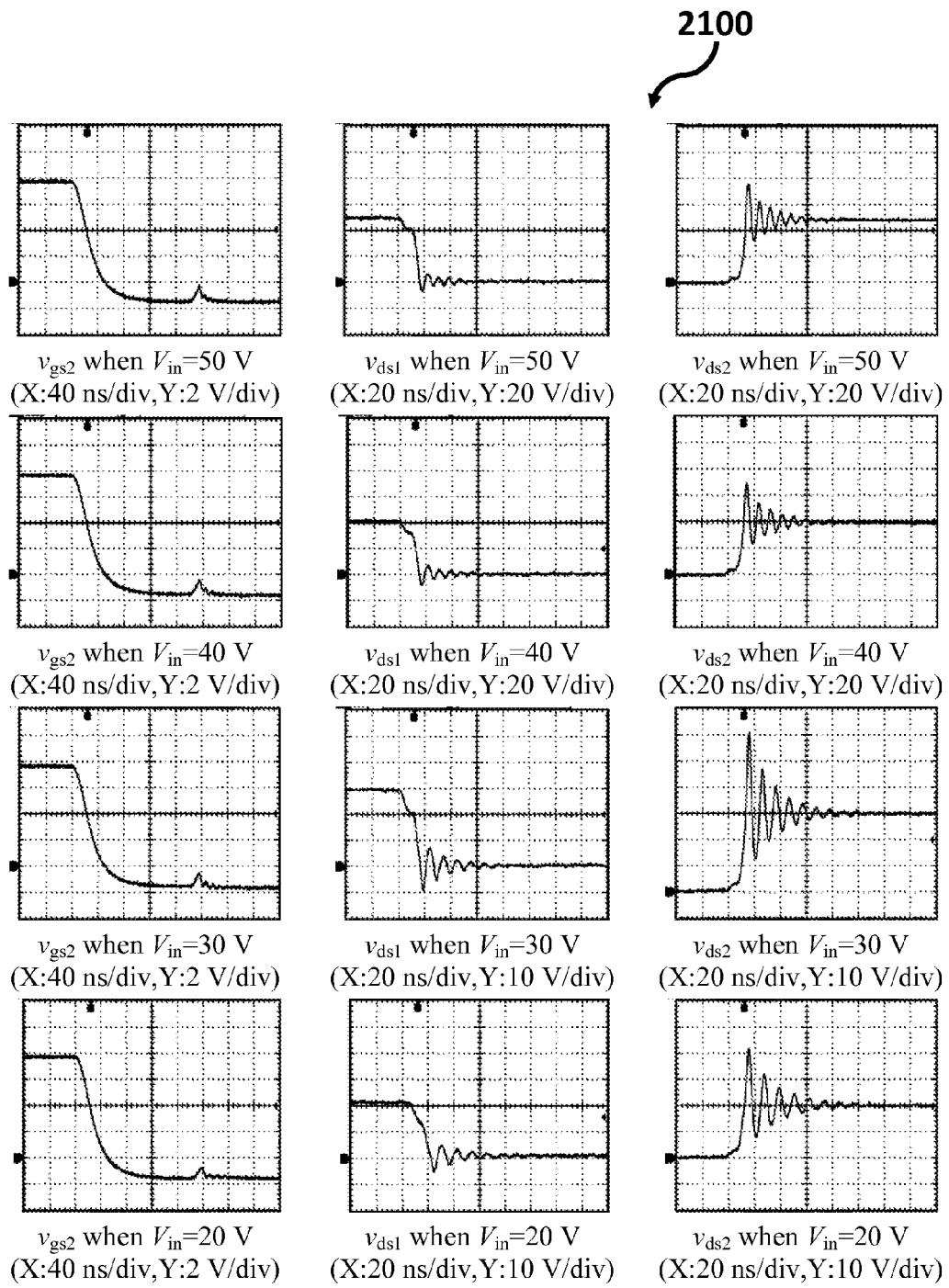
FIG. 21 shows different switching waveforms produced in the test bench of FIG. 17 under different input voltages $V_{in}$.

FIG. 21 shows the different switching waveforms 2100 produced in the test bench 1700 of FIG. 17 under different input voltages $V_{in}$. As shown in FIG. 21, the spurious triggering pulse decreases with the reduction in input voltage, whereas, the shifting level of the gate-source voltage is independent of the input voltage level.

II. Output Current $I_O$

Figure 22:
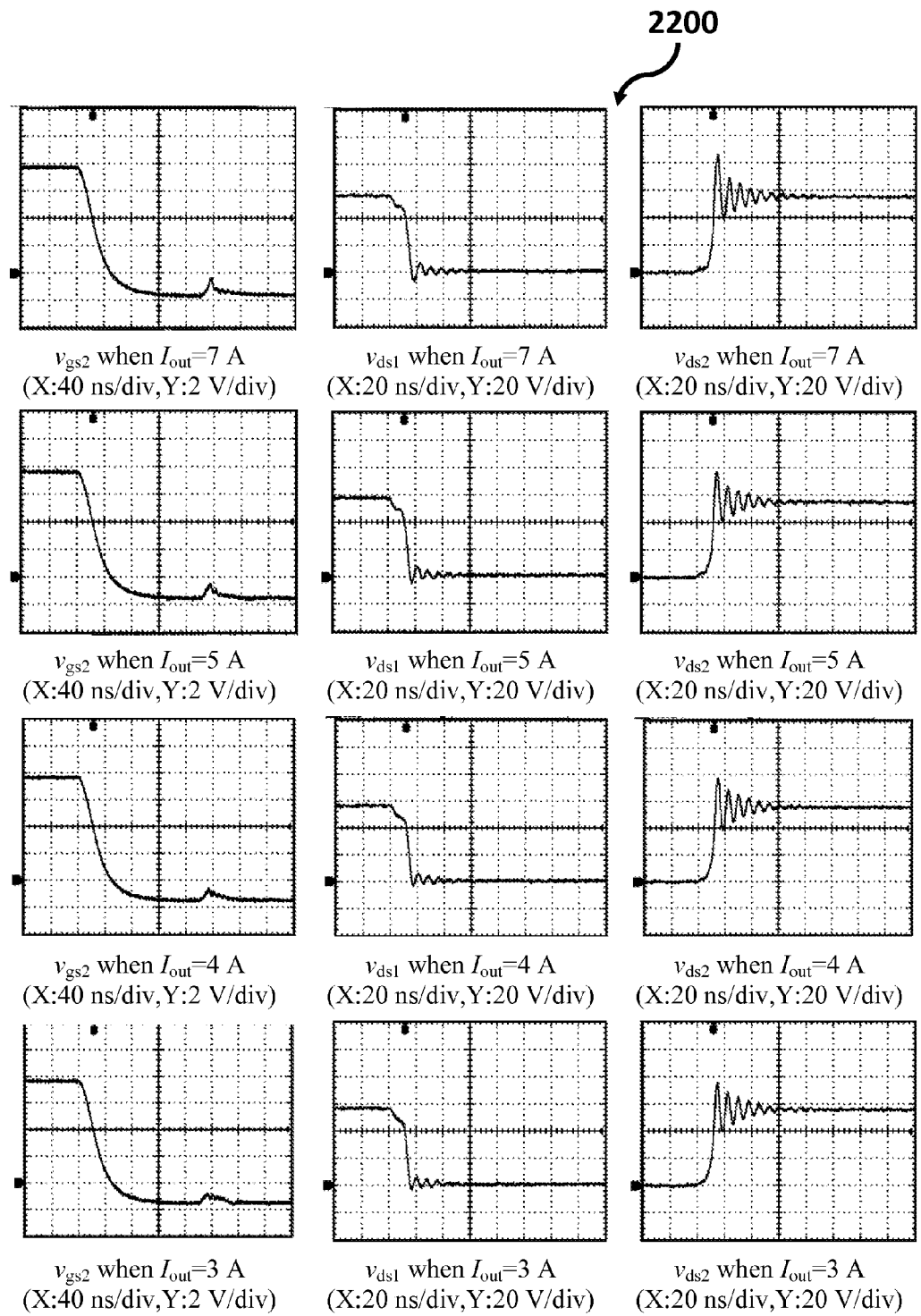
FIG. 22 shows different switching waveforms produced in the test bench of FIG. 17 under different output currents $I_0$.

FIG. 22 shows the different switching waveforms 2200 produced in the test bench 1700 of FIG. 17 under different output currents $I_O$. As shown in FIG. 22, the spurious triggering pulse increases with the increase in the output current, and the operation of the level-shifter 1000 of the present invention is substantially unaffected by the output current level thereby the shifting level of the gate-source voltage remains unchanged.

III. $C_N$ and $C_P$

Figure 23:
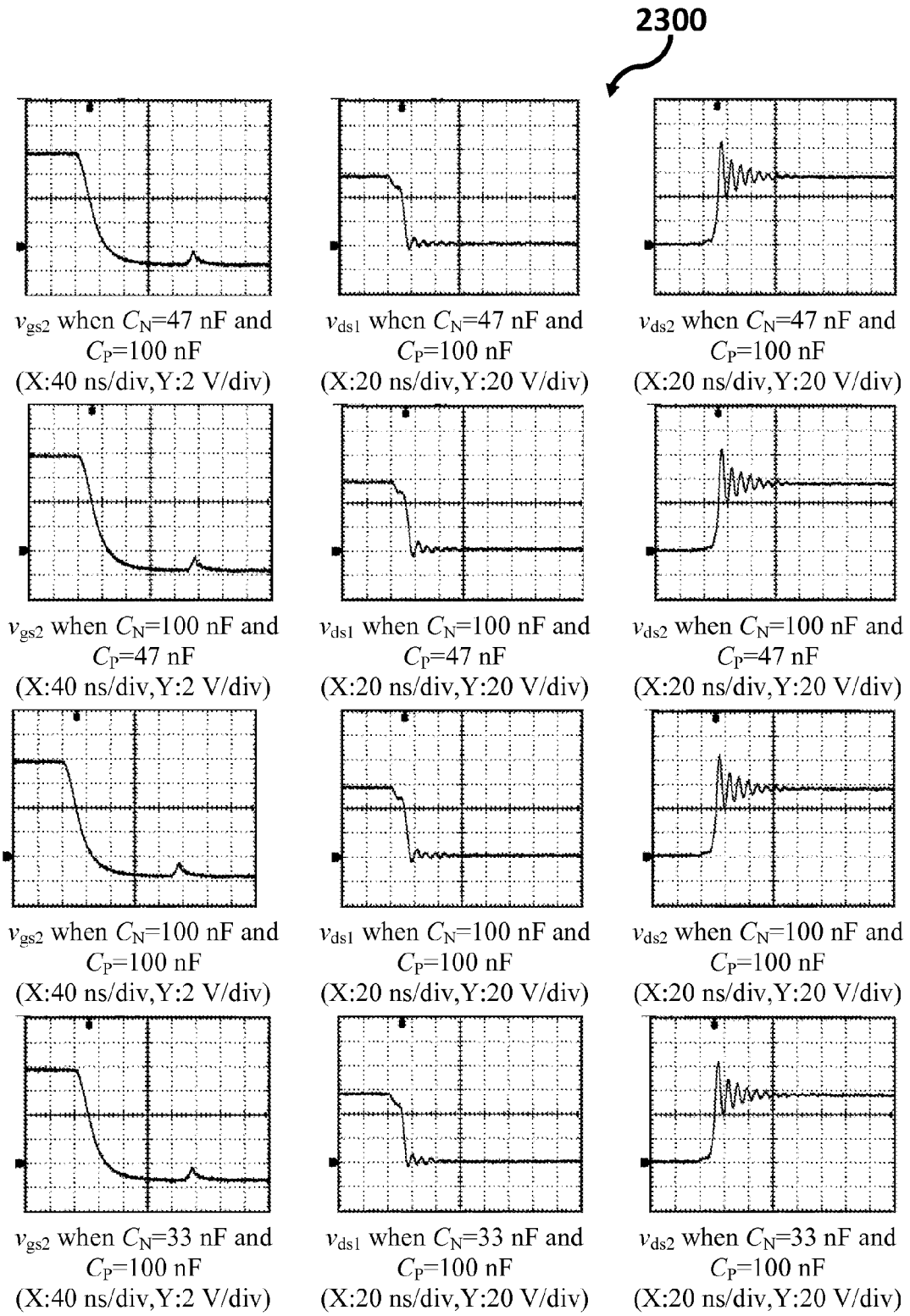
FIG. 23 shows different switching waveforms produced in the test bench of FIG. 17 under different capacitances $C_N$ and $C_P$.

The capacitances $C_N$ and $C_P$ in the level-shifter 1000 in one embodiment of the present invention are varied to make the ratio $C_N/C_P$ deviate from $R_N/R_P$, which is fixed. FIG. 23 shows the different switching waveforms 2300 produced in the test bench 1700 of FIG. 17 confirming that $C_N/C_P$ does not have to remain at $R_N/R_P$ to allow the level-shifter 1000 to perform as expected.

IV. $R_N$ and $R_P$

Figure 24:
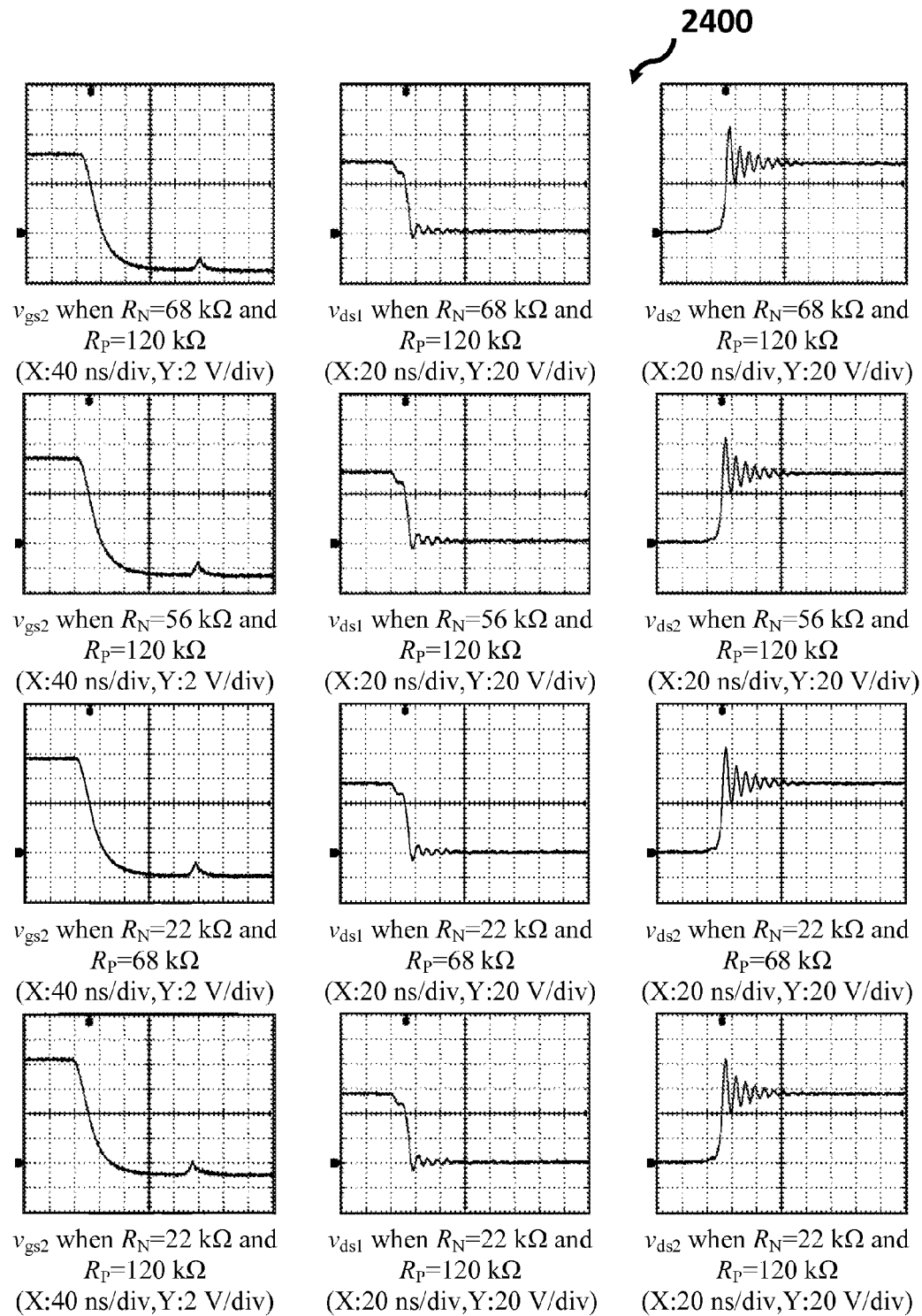
FIG. 24 shows different switching waveforms produced in the test bench of FIG. 17 under different resistances $R_N$ and $R_P$.

FIG. 24 shows different switching waveforms 2400 produced in the test bench 1700 of FIG. 17 under different resistances $R_N$ and $R_P$. FIG. 24 shows the ratio between $R_N$ and $R_P$ is responsible for determining the shifting-level of the gate-source voltage, and that this level will not influence the switching speed of the MOSFETs. FIG. 25 is a table 2500 showing and comparing the theoretical and experimental results of the shifting-level of the gate-source voltage under different resistances $R_N$ and $R_P$. The results as shown in FIGS. 24 and 25 are in good correspondences and mild discrepancies arise from the conduction voltage of the diodes, which is assumed zero in theoretical analysis.

V. Duty Cycle D

Figure 26:
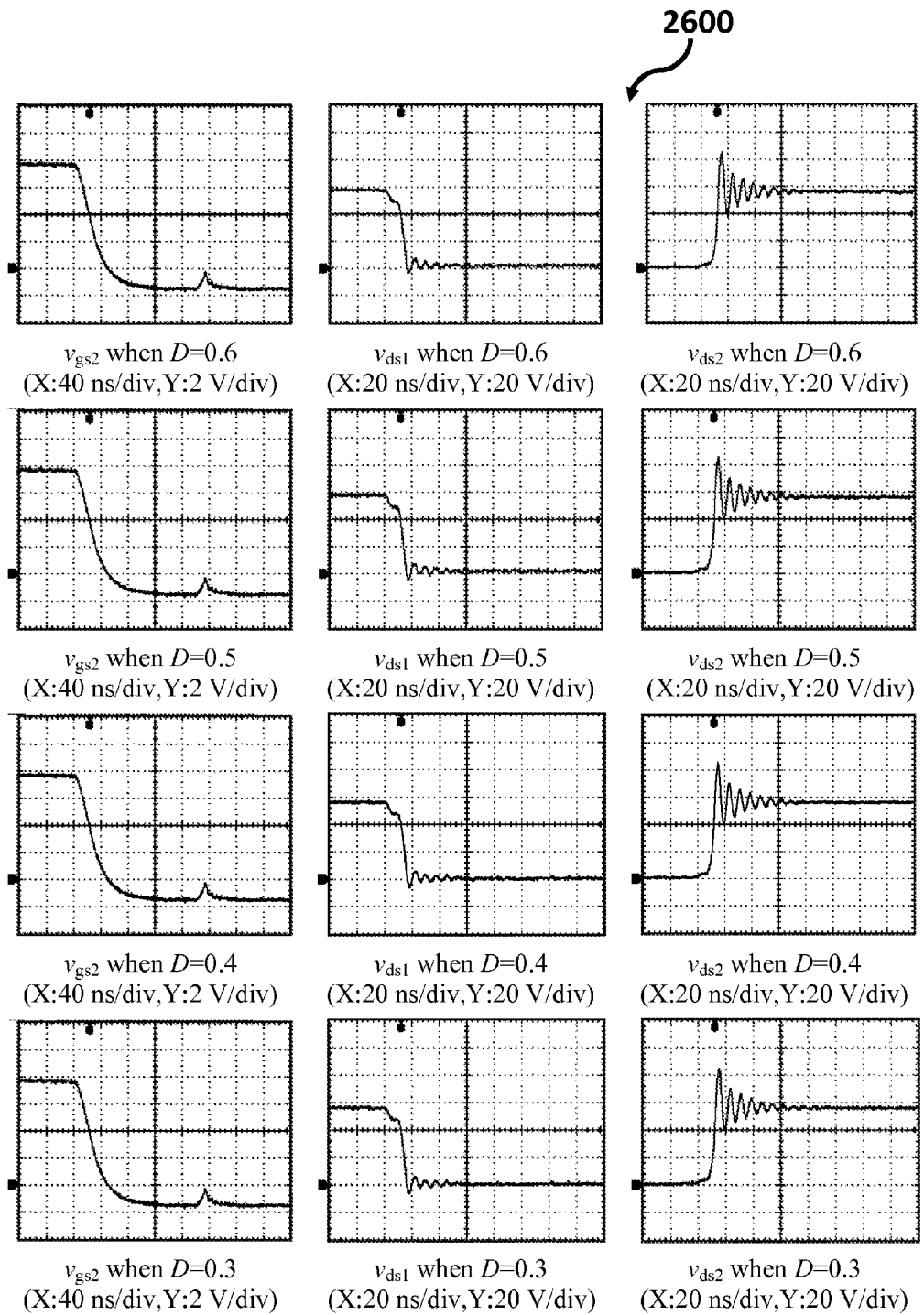
FIG. 26 shows different switching waveforms produced in the test bench of FIG. 17 under different duty cycles D.

One of the advantages of the present invention is that the shifting level of the level shifter 1000 does not change with the variation in duty cycle. FIG. 26 shows different switching waveforms 2600 produced in the test bench 1700 of FIG. 17 under different duty cycles D. As shown in FIG. 26, with substantial variation in the duty cycle, the variation in the shifting level of the level-shifter 1000 of the present invention is barely noticeable, which is a desirable feature.

VI. The Resonant Inductor $L_R$

Figure 27:
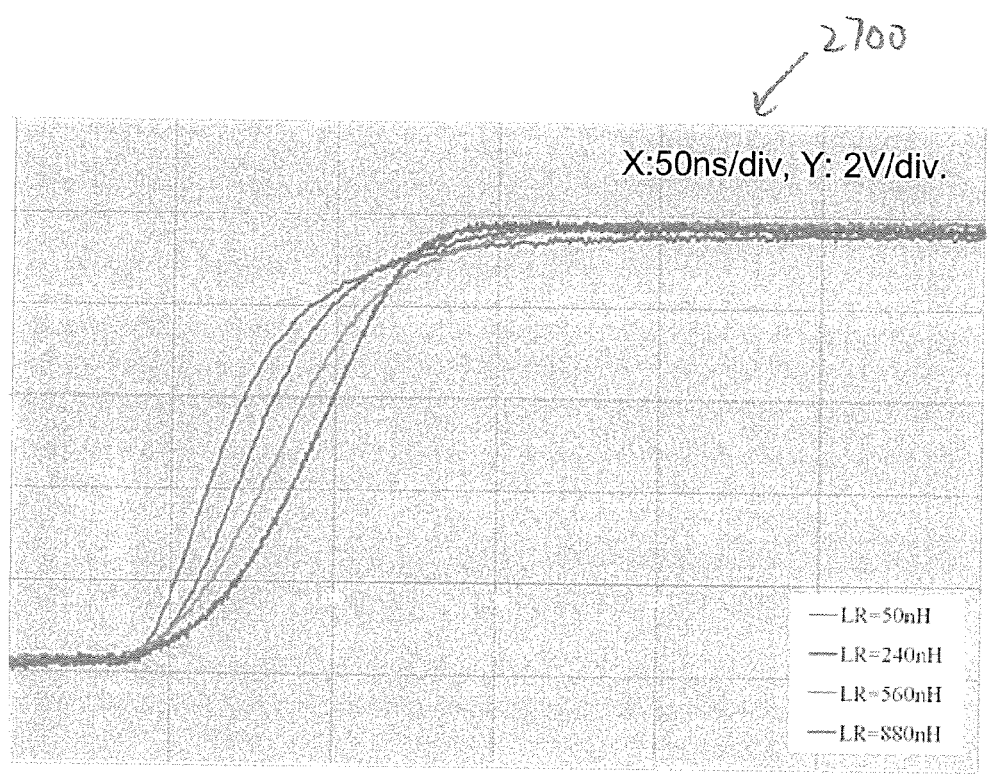
FIG. 27 is a graph showing the switching signals generated by the level shifter of FIG. 14A employed in the test bench of FIG. 17 under different inductances $L_R$.

The level shifter 1400 in accordance with the embodiment of FIG. 14A is employed in the test bench 1700 of FIG. 17 to show that the turn-on switching speed can be changed by the resonant inductor $L_R$. FIG. 27 is a graph 2700 showing the switching signals generated by the level shifter 1400 of FIG. 14A employed in the test bench 1700 of FIG. 17 under different inductances $L_R$. The result of FIG. 27 shows that the rising edge of $v_{g,2}$ slows down with the increase in $L_R$.

The technical advantages of various embodiments of the present invention include a shifting level independent of the duty cycle and the power rating. More importantly, the various embodiments of the present invention can also be readily and easily adjusted to meet different design requirements. Other advantages of the present invention in terms of function, structure, cost, and design, or any other aspects, will be apparent to the person skilled in the art. Although the embodiments of the present invention have been described specifically with reference to a MOSFET device, it should be noted that the present invention can be readily adapted to be applied on any solid state electronic device such as semiconductors or transistor devices.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. A signal modulating interface for a solid state electronic device comprising:
    an input arranged to receive a control signal from a driver arranged to control the solid state electronic device;
    a signalling module connected to the input wherein the signalling module is arranged to generate a modulated control signal by eliminating unwanted triggering signal portions capable of false triggering the solid state electronic device from the control signal for transmission to the solid state electronic device;
    wherein the signal modulating interface is disposed between the solid state electronic device and the driver;
    wherein the signal modulating interface is arranged to modulate the control signal such that the unwanted triggering signal portions of the control signal are modulated to be below a triggering threshold of the solid state electronic device;
    wherein the signalling module comprises at least one voltage source arranged to generate at least one modulating voltage for modulating the control signal;
    wherein the at least one voltage source is connected in series with an output of the driver; and,
    wherein the modulated control signal comprises a positive voltage signal when the driver outputs an activation control signal $V_{g,H}$ for activating the solid state electronic device and a negative voltage signal when the driver outputs a deactivation control signal $V_{g,L}$ for deactivating the solid state electronic device.

2. A signal modulating interface in accordance with claim 1, wherein the negative voltage signal is arranged to modulate the unwanted triggering signal portions to be below the triggering threshold of the solid state electronic device.

3. A signal modulating interface in accordance with claim 2, wherein the at least one voltage source for modulating the control signal is an external active voltage source.

4. A signal modulating interface in accordance with claim 3, wherein the external active voltage source comprises at least one dc-dc converter or at least one dc-ac converter.

5. A signal modulating interface in accordance with claim 2, wherein the at least one voltage source for modulating the control signal is a passive voltage source comprising a circuit arrangement.

6. A signal modulating interface in accordance with claim 5, wherein the circuit arrangement comprises capacitive components, resistive components, and semiconductor components.

7. A signal modulating interface in accordance with claim 6, wherein the circuit arrangement is arranged without any external voltage sources.

8. A signal modulating interface in accordance with claim 7, wherein the circuit arrangement comprises two capacitors $C_N$ and $C_P$; two resistors $R_N$ and $R_P$; and a diode $D_P$.

9. A signal modulating interface in accordance with claim 8, wherein the circuit arrangement is arranged such that the capacitor $C_N$ and the resistor $R_N$ is connected in parallel defining a voltage $V_{CN}$; the capacitor $C_P$ and the resistors $R_P$ is connected in parallel defining a voltage $V_{CP}$; and the diode $D_P$ is being disposed between the two capacitors $C_N$ and $C_P$.

10. A signal modulating interface in accordance with claim 9, wherein the circuit arrangement is arranged to modulate the control signal such that the positive voltage of the modulated control signal for activating the solid state electronic device is $V_{CP}$ and the negative voltage of the modulated control signal for deactivating the solid state electronic device is $-V_{CN}$.

11. A signal modulating interface in accordance with claim 10, wherein magnitude of the voltages $V_{CN}$ and $V_{CP}$ are dependent on a ratio between the resistors $R_N$ and $R_P$.

12. A signal modulating interface in accordance with claim 11, wherein magnitude of the voltages $V_{CN}$ and $V_{CP}$ are independent on a duty cycle of the solid state electronic device.

13. A signal modulating interface in accordance with claim 12, wherein $V_{CN}$ and $V_{CP}$ are defined by $$V_{CN} = \frac{R_N}{R_N + R_P} V_{g,H} \text{ and } V_{CP} = \frac{R_P}{R_N + R_P} V_{g,H}$$

at steady state.

14. A signal modulating interface in accordance with claim 13, wherein the circuit arrangement is arranged such that $V_{CN}$ and $V_{CP}$ remain substantially constant at all times and are independent of the control signal outputted from the driver.

15. A signal modulating interface in accordance with claim 14, wherein $V_{CN}$ and $V_{CP}$ remain substantially constant by arranging time constants $R_N C_N$ and $R_P C_P$ to be much longer than a switching period of between the positive and negative voltages; and arranging the capacitance of capacitor $C_N$ and/or $C_P$ to be much larger than a capacitance $C_{gs}$ associated with the solid state electronic device.

16. A signal modulating interface in accordance with claim 15, wherein the capacitances and resistances of the capacitors and resistors are defined by $R_N C_N = R_P C_P$ for accelerating a transition between voltages $V_{CP}$ and $-V_{CN}$.

17. A signal modulating interface in accordance with claim 16, further comprising an accessory circuit arranged to alter a transition time from $-V_{CN}$ to $V_{CP}$.

18. A signal modulating interface in accordance with claim 17, wherein the accessory circuit comprises inductive components and semiconductor devices.

19. A signal modulating interface in accordance with claim 17, wherein the accessory circuit comprises an inductor $L_R$ and two diodes arranged in a circuit loop.

20. A signal modulating interface in accordance with claim 17, wherein the accessory circuit is disposed between the driver and the signalling module of the signal modulating interface for altering the transition time from $-V_{CN}$ to $V_{CP}$.

21. A signal modulating interface in accordance with claim 15, wherein the solid state electronic device is a transistor device.

22. A signal modulating interface in accordance with claim 21, wherein the transistor device is a MOSFET.

23. A signal modulating interface in accordance with claim 22, wherein the capacitance $C_{gs}$ associated with the solid state electronic device is a gate-source capacitance of the MOSFET.

24. A signal modulating interface in accordance with claim 23, wherein the driver for controlling the solid state electronic device is a gate driver.

25. A signal modulating interface in accordance with claim 24, wherein the signal modulating interface is disposed between the gate driver and the MOSFET gate.

* * * * *